United States Patent [19]
Cooper et al.

[11] Patent Number: 5,113,131
[45] Date of Patent: May 12, 1992

[54] VOLTAGE MEASURING DEVICE HAVING ELECTRO-OPTIC SENSOR AND COMPENSATOR

[75] Inventors: David E. Cooper, Glendora; Thomas J. Houy, Claremont, both of Calif.

[73] Assignee: Southern California Edison Company, Rosemead, Calif.

[21] Appl. No.: 482,004

[22] Filed: Feb. 16, 1990

[51] Int. Cl.$^5$ .................... G01R 19/00; G01R 31/00; G02F 1/09

[52] U.S. Cl. ........................ 324/96; 324/158 R; 324/77 K; 359/246

[58] Field of Search .............. 324/158 R, 158 D, 73.1, 324/77 K, 96; 350/374, 375, 376, 377–378, 355, 356, 357; 250/231.1, 225; 356/400, 352; 455/616, 606; 332/7.51

[56] References Cited

U.S. PATENT DOCUMENTS

| | | | |
|---|---|---|---|
| 3,571,597 | 3/1971 | Wood et al. | 455/616 |
| 3,780,296 | 12/1973 | Waksberg et al. | 250/225 |
| 3,956,626 | 5/1976 | Ross | 455/616 |
| 3,971,930 | 7/1976 | Fitzmaurice et al. | 455/616 |
| 4,070,621 | 1/1978 | Bassen et al. | 324/96 |
| 4,277,146 | 7/1981 | Morgan et al. | 350/356 |
| 4,637,072 | 1/1987 | Hellström | 324/96 |
| 4,730,109 | 3/1988 | Afromowitz | 250/226 |
| 4,841,234 | 6/1989 | Aoshima et al. | 350/376 |
| 4,920,310 | 4/1990 | Aoshima et al. | 324/96 |

OTHER PUBLICATIONS

Optical Power Line Voltage and Current Measuring Systems, vols. I & II, National Bureau of Standards and Electric Power Research Institue (Sep. 1987).
Advanced Primary Transducers, EPRI and McGraw–Edison Power Systems, Cooper Industries, Inc., draft Final Report (dated Jan. 26, 1988).
"A Kerr Electro-Optical Technique for Observation and Analysis of High-Intensity Electric Fields," by Cassidy and Cones, Journal of Research of the National Bureau of Standards, vol. 73C, Nos. 1 and 2, May 19, 1969, pp. 5–13.
"New Techniques for High Voltage Measurements," Technical News Bulletin, National Bureau of Standards, Sep. 1972, pp. 207–209.
"Dielectric Polarization and Alignment and the Structure of Polar Fluids", Ramshaw et al., The Journal of Chemical Physics, vol. 54, No. 3, Feb. 1, 1971, pp. 1239–1251.
"Optical Methods of Electrical Measurement at High Voltage Levels," Hebner, Jr.; et al., Proceedings of IEEE, Nov. 1977.

*Primary Examiner*—Vinh Nguyen
*Attorney, Agent, or Firm*—Christie, Parker & Hale

[57] ABSTRACT

An apparatus and method for measuring an unknown voltage using electro-optic materials includes a beam transmitter, voltage sensor, and a receiver. The beam transmitter generates an electro-magnetic beam directed at an electro-optic material in the sensor. The electro-optic material has a voltage gradient across it due to the unknown voltage. The beam is such that it has components both parallel and perpendicular to the direction of the voltage gradient so that passing through the electro-optic material creates a phase difference between the parallel and perpendicular components. This beam with the phase difference passes to the receiver where the beam passes through a compensator formed by another electro-optic material subjected to a voltage gradient from a measurable voltage. The measurable voltage is controlled to produce another relative phase retardation which compensates for the phase retardation produced at the sensor. The net retardation caused by the two electro-optic materials is detected using first and second detectors for converting the intensities of the parallel and perpendicular components into respective first and second voltages. The first and second voltages are compared and the resulting difference signal is used for driving the voltage gradient across the electro-optic material in the compensator. This feedback arrangement creates a comparator output of zero when the net retardation caused by the sensor and compensator is equal to $\pi/4$ or $\pi/4 + n\,\pi/2$ where n is any integer number. Several variations of this embodiment are disclosed.

57 Claims, 10 Drawing Sheets

VOLTAGE MEASURING DEVICE HAVING ELECTRO-OPTIC SENSOR AND COMPENSATOR

BACKGROUND OF THE INVENTION

This invention relates to electro-optic measuring devices, and in particular to a means and a method for measuring voltage by electro-optic response.

Researchers have longed to develop a device which uses electro-optic response to measure voltage. However, researchers have been unable to develop a practical way to measure voltage without using a complex device and a computer for purposes of interpreting electro-optic data to determine an unknown voltage. In 1987, the Electric Power Research Institute (EPRI) issued a report, prepared by the National Bureau of Standards, titled *Optical Power Line Voltage and Current Measurement Systems*, Volumes I and II, September 1987, which indicates that standard current and voltage transformers are reliable measuring devices but are expensive and even dangerous when adapted for measuring high voltages. Volume I of the Report describes an example of an electro-optic voltage sensor. An electrooptic crystal has an unknown electric field applied to it. The crystal also receives circularly polarized light traveling in a direction perpendicular to the field and outputs the light with a relative phase shift due to the birefringent effect of the electric field on the light. The amount of relative phase shift of the "cross-plane" component (i.e., the light component in a plane transverse to the electric field) with respect to a "parallel plane" component (i.e., the light component in a plane parallel to the "stress axis" i.e. the electric field) is related to the strength of the electric field.

The Report does not suggest any simple way to process the light output from the electro-optic element to determine the electric field and thus the voltage. The Report discusses several practical problems including thermal and piezoelectric effects that make accurate voltage measurement very difficult. Accordingly, the Report indicates that electro-optic devices are not yet practical. For example, a high DC component of the electric field and thermal and piezoelectric effects may create a much greater relative phase shift than the AC component of the field. The high DC component cannot be measured easily with limited gain and thus AC cannot easily be measured. Development of a practical electro-optical measuring device would be useful for achieving virtually instantaneous measurement across a wide band of response. Moreover, electro-optic measurement is substantially free of any electrical interference. Accuracy can be quite high in spite of thermal effects. In fact, the Report states that accuracy can be near 1% even at temperatures over 100° C., and that by using temperature compensation accuracy can be improved by a factor of ten. Such a device would have a low cost, and be quite versatile, as optical devices can also measure temperature, pressure and even perform chemical analysis of gases.

SUMMARY OF THE INVENTION

The invention provides a reliable, accurate, inexpensive and practical electro-optic measuring system including a device and method. It also provides an electro-optic measuring system that uses a first electro-optic element to sense voltage or other quantities and a second electro-optic element to measure the voltage. The system works without a computer, and without the need to determine physical and thermal stresses operating on the elements.

In one embodiment, the device is formed by a transmitter, sensor and receiver. The transmitter generates monochromatic circularly polarized light. This light is incident upon and passes through an electro-optic element, e.g., a crystal or an amorphous substance, in the sensor. The sensor includes electrodes, either encapsulated in or positioned on opposite surfaces of the element, across which an unknown electric field, such as from a high voltage transmission line, is applied. The light beam experiences a relative phase shift of its cross and parallel plane components based on the electric field, and often also based on various other factors such as thermal and mechanical stresses on the crystal. When the light emerges from the sensor, it enters a compensator which primarily consists of another electrooptic element, e.g., another crystal or amorphous substance, in the receiver. The element in the receiver is subjected to an electric field of such strength and polarity to cause a shift of the cross component relative to the parallel component which combines with the shift caused by the element in the sensor. The combination of the phase shifts (retardations) created by the sensor and receiver are controlled by feedback circuitry to result in a predetermined relative retardation.

In particular, the light emerging from the compensator is split by a polarizing beam splitter and the cross and parallel components are fed to respective detectors which output voltages proportional to the intensities of these components. The output voltages are compared and the difference signal drives a high voltage operational amplifier (op-amp). The output of the op-amp controls the electric field across the electro-optic element in the receiver. As a result of this feedback, the circuit will tend to drive the detector outputs to equal amounts so that the output of the comparator becomes zero. When this condition is satisfied, the difference signal is related in a known way to the unknown voltage based on the electro-optic characteristics and the effective lengths and thicknesses of the elements at the sensor and receiver. The presence of any time varying noise from thermal or mechanical stresses on the sensor (and/or compensator) will create time varying components in the comparator output in addition to the component due to the unknown voltage.

Various output circuitry and a display device are used to filter out and measure the AC component of the time varying difference signal and display the unknown voltage based on the AC component.

In other embodiments of the invention, fiber optic cables transmit the light between the transmitter, sensor and receiver. In addition, mirrors can be used to increase the effective lengths of the sensor and compensator.

In a further embodiment of the invention, the unknown voltage is applied across a plurality of sensor elements, which thus act essentially as a voltage divider. Each sensor element receives a light beam, and each beam is processed by a respective compensating element. The voltages on each compensator are converted into the portion of the unknown voltage which is acting on the sensor element associated with that compensator, and the portion for each sensor is summed to determine the total unknown voltage.

BRIEF DESCRIPTION OF THE DRAWINGS

The above features and advantages of the invention as well as additional features and advantages will be more evident upon a reading of the detailed description set forth below in conjunction with the drawings in which.

DETAILED DESCRIPTION OF THE PREFERRED EMBODIMENTS

Figure 1:
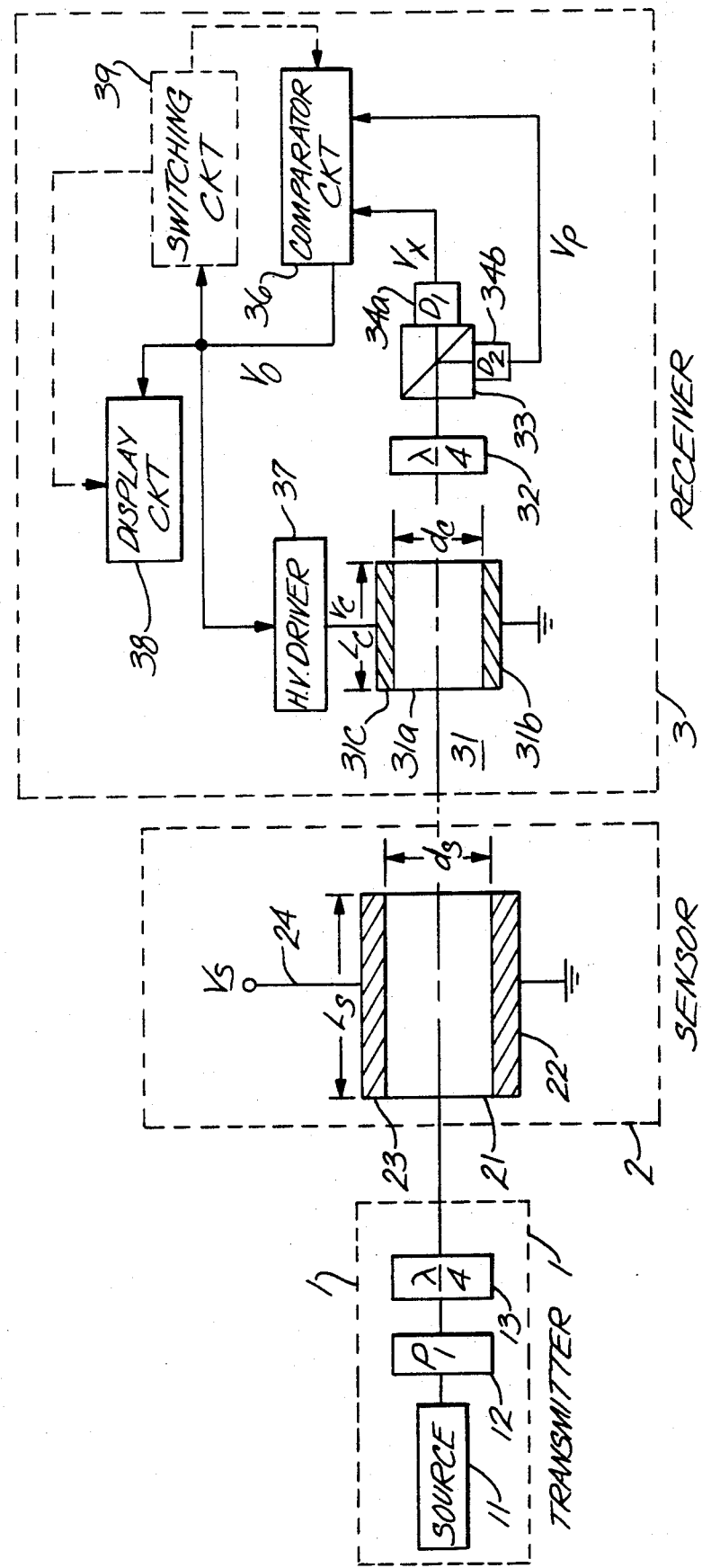
FIG. 1 is a schematic of a first embodiment of a measuring device according to the invention.

The present invention is an apparatus and a method for measuring unknown electromotive force (voltage) or other forces using electro-optic (E-O) materials which exhibit a birefringent effect. This birefringent effect can operate on visible light or any other suitable electromagnetic radiation.

Before describing the illustrated embodiments of the invention, underlying principles of the invention will be explained. In general, a device according to the invention consists of a transmitter for generating electromagnetic radiation, preferably a monochromatic light beam, a sensor and a receiver. The transmitter directs the light at an E-O element (i.e., the E-O material) in the sensor. The E-O element has an unknown voltage ($V_s$) applied across it by electrodes. The light beam is transmitted to the sensor in such a way as to create two transverse components (preferably cross and parallel components). The electric field applied to the E-O element causes a relative phase shift ($D_s$) ("D" in the text when used for phase shift represents delta in the drawings) of the cross component relative to the parallel component. The receiver has a compensator device which includes another E-O element. This compensating E-O element has a measurable voltage applied across it, the measurable voltage being generated based on a difference between the relative phase shift $D_s$ and a relative phase shift ($D_c$) caused at the compensating element. In a simple situation, the compensating element would be exactly the same in material characteristics and dimensions as the sensing element so that the measurable voltage would be exactly the same in magnitude as the unknown voltage $V_s$.

Figure 12:
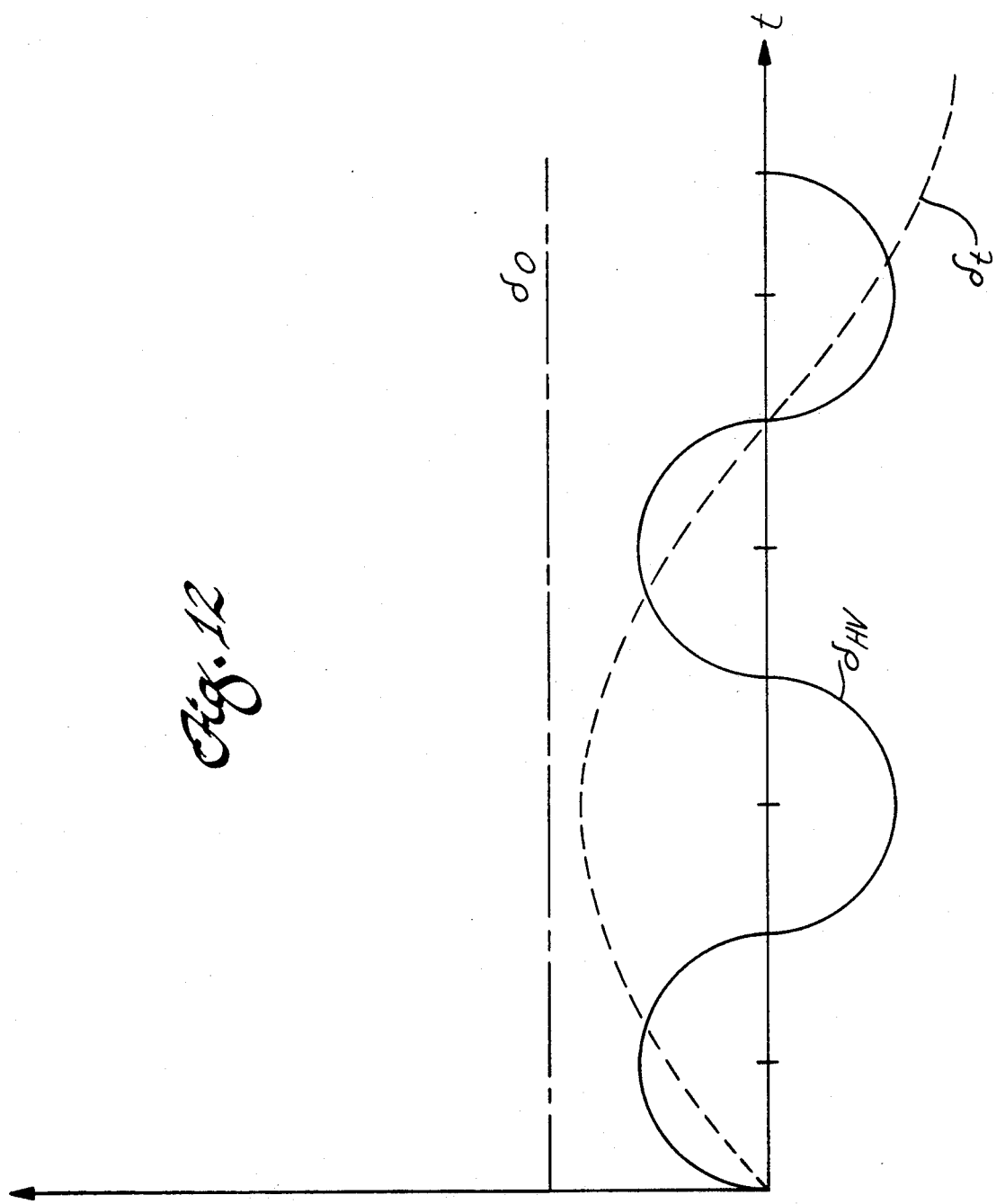
FIG. 12 is a waveform diagram of components of a retardation angle created by the sensor in the measuring device according to the invention, provided for purposes of explaining concepts underlying the invention.

However, normally, the phase shift $D_s$ will be the result of not only the voltage $V_s$ but also any mechanical and thermal stresses (including any anisotropies in the sensing material) and other sources of noise acting on the E-O sensing element. These mechanical and thermal stresses create phase shifts that normally have a constant component ($D_0$) and a time varying component ($D_t$), as shown in FIG. 12. The presence and magnitude of phase shifts $D_0$ and $D_t$ have in the past made it extremely difficult and impractical to accurately measure the unknown voltage $V_s$ based on E-O response. In fact, the magnitude of phase shifts $D_0$ and $D_t$ are usually many times the magnitude of the phase retardation component ($D_{HV}$) due solely to voltage $V_s$.

It should be noted that $D_t$ is shown as a smooth curve, but it also can itself be a combination of several time varying components generally substantially lower in frequency than phase shift component $D_{HV}$. It should also be noted that compensator phase shift $D_c$ may also include thermal and mechanical stresses, but the effect of these stresses can be combined with and thus treated as part of phase shift components $D_0$ and $D_t$.

Even if one were to somehow eliminate phase shift components $D_0$ and $D_t$, e.g., by using E-O sensing and compensating materials such as an incompressible fluid with a mechanism to keep the fluid steady and at constant temperature, it would be difficult to produce and measure a voltage across the compensating material that exactly matches voltage $V_s$, where $V_s$ is a high voltage such as 12 kV or 15 kV. In spite of the above and other practical limitations on the use of E-O materials to measure high voltage, the present invention enables determination of voltage $V_s$ regardless of any mechanical and thermal stresses, without the need to determine these stresses, and without the need to produce a voltage that is as great as voltage $V_s$ in magnitude.

Figure 11:
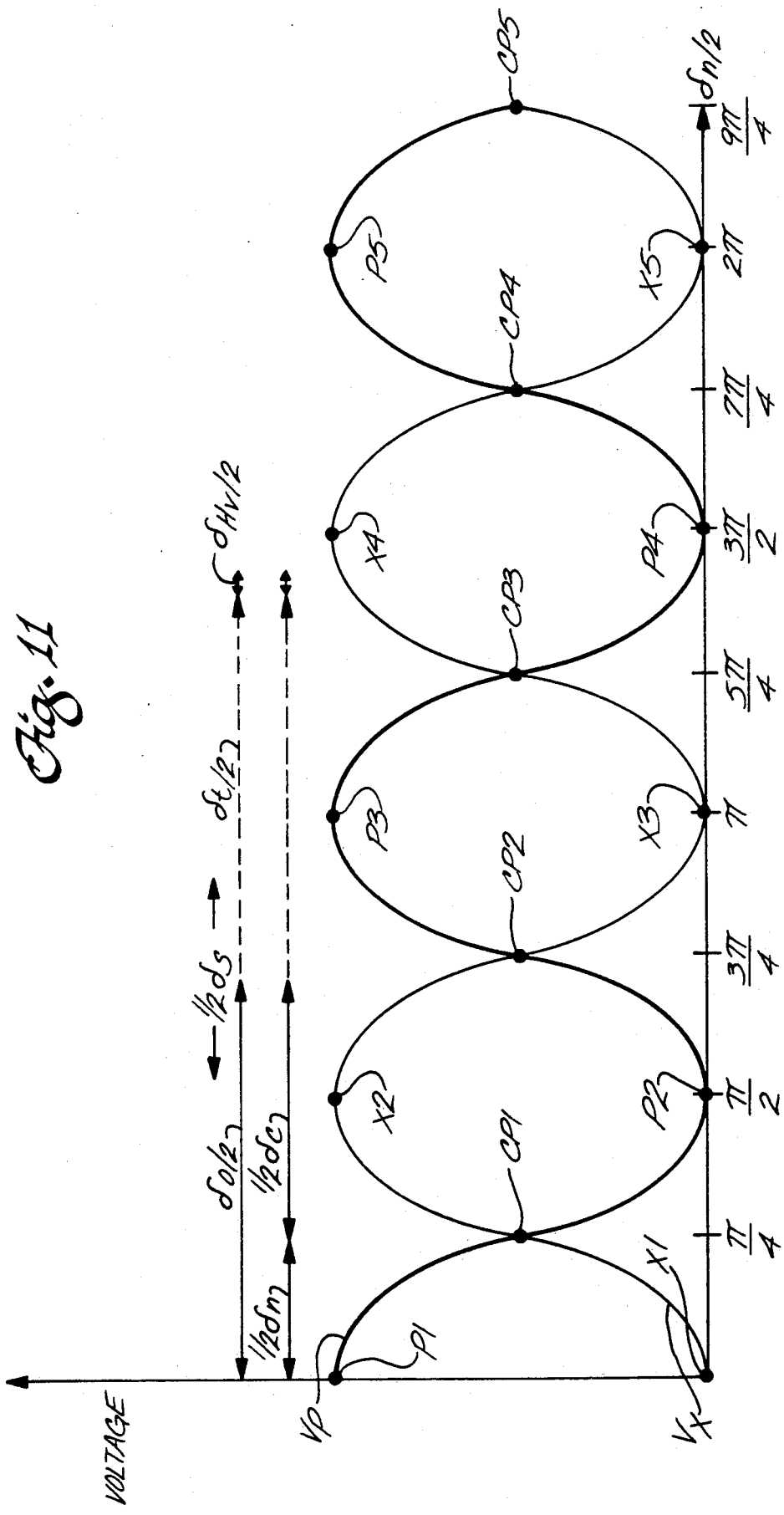
FIG. 11 is a waveform diagram of detected voltages versus one-half a net phase retardation angle, provided for purposes of explaining concepts underlying the invention.

To compensate for the practical constraint of limited power supply at the compensator and for any thermal or mechanical stresses especially likely to affect the sensor, in the invention the phase shift at the compensator is controlled such that when added to the phase shift due to the sensor, the result is a constant phase retardation (net phase retardation $D_n$ shown in FIG. 11). That is, the phase retardations at the sensor and compensator satisfy the following equation:

$$D_s + D_c = D_n \quad (1)$$

(In FIG. 11, $D_c$ is opposite in sign to $D_s$.) Again, in a simple case, $D_s$ would consist only of $D_{HV}$, and $D_n$ would be constant (e.g., $D_s/2 = \pi/4$ in FIG. 11), such that the magnitude of the compensator phase shift $D_c$ would be directly related to $V_s$. In the situation where the variations in $D_s$ cannot be matched in magnitude by variations in compensator retardation $D_c$ due to limitations on the voltage applied to the compensator, the details of how equation (1) remains satisfied will be explained later. In all cases, since the compensator retardation $D_c$ will be controlled to at least mirror the changes in sensor retardation $D_s$ due to retardation component $D_{HV}$, the relationship between the voltage ($V_c$) applied to the compensator and the voltage ($V_s$) applied to the sensor will be determined by the physical characteristics of the compensating E-O material and electrodes in relation to the physical characteristics of the sensing E-O material and electrodes. In general, to determine any phase shift D as a result of an electric field across an E-O element, equation (2) below is used for a material exhibiting a Pockels effect and equation (3) is used for a Kerr effect:

$$D = \pi B_p E L \quad (2)$$

$$D = \pi B_k E^2 L \quad (3)$$

where D is the phase shift (in radians), $B_p$ and $B_k$ are the Pockels and Kerr coefficients, respectively, which are a function of the physical characteristics of the E-O material, E is the electric field, and L is the effective length of the field. To calculate the field, one can use the well-known relationship that the magnitude of the voltage (V) equals electric field (E) multiplied by the distance (d) across which the voltage is being applied. In view of equations (2) and (3), there are four possible permutations for the voltage $V_s$ in terms of voltage $V_c$, as shown below (the symbols are defined following the last equation):

Both the compensator and sensor have Kerr elements:

$$V_s = V_c / [(d_c/d_s)(B_{ks}L_s/B_{kc}L_c)^{\frac{1}{2}}] \quad (4)$$

Both the compensator and sensor have Pockels elements:

$$V_s = V_c / [(d_c B_{ps} L_s)/(d_s B_{pc} L_c)] \quad (5)$$

The compensator is a Kerr element and the sensor is a Pockels element:

$$V_s = V_c^2 / [(1/d_s)^2 (d_c B_{ps} L_s / B_{kc} L_c)^{\frac{1}{2}}] \quad (6)$$

The compensator is a Pockels element and the sensor is a Kerr element:

$$V_s = V_c^{\frac{1}{2}} / [(d_c B_{ks} L_s)/d_s^2 B_{pc} L_c]^{\frac{1}{2}} \quad (7)$$

where
- $V_s$ = voltage across the sensing E-O element;
- $V_c$ = voltage across the compensating E-O element;
- $d_s$ = distance across the sensing E-O element;
- $d_c$ = distance across the compensating E-O element;
- $L_s$ = effective length of the electric field applied to the sensing E-O element;
- $L_c$ = effective length of the electric field applied to the compensating E-O element;
- $B_{ks}$ and $B_{ps}$ are the Kerr and Pockels coefficients, respectively, for the sensing E-O element; and
- $B_{kc}$ and $B_{pc}$ are the Kerr and Pockels coefficients, respectively, for the compensating E-O element.

For any given sensor and compensator characteristics, $V_s$ is related to various constants times $V_c$. Since in reality a portion of compensator voltage $V_c$ will be a function of time varying retardation component $D_t$, only the portion of voltage $V_c$ which is related to high voltage retardation component $D_{HV}$ should be included in the $V_c$ in the above equations. In order to determine the voltage which is due only to $D_{HV}$, a filter to capture only the voltage with a frequency having an appropriate relationship (explained below) to that for the unknown voltage, i.e., $V_s$, is used. The result is the following equation:

$$V_s = K(V_c')^z \quad (8)$$

where
- K = a constant corresponding to the coefficient of $V_c^z$ obtained from one of equations (4) through (7) above,
- z = 1, $\frac{1}{2}$, or 2, depending upon which one of equations (4) through (7) represents the relationship between the compensator and sensor, and
- $V_c'$ = the portion of $V_c$ at a frequency having the appropriate relationship to that of $V_s$.

Suitable materials for element 21 include solids or liquids such as PMMA (polymethylmethacrylate or plexiglass), transformer oil, ethylene carbonate or nitrobenzene. Suitable materials for element 31a include ferroelectric materials such as lithium niobate.

With the above theory in mind, specific exemplary embodiments of the invention will now be described.

FIG. 1

In FIG. 1, there is a transmitter 1 which emits electromagnetic radiation through an E-O sensor 2 to a receiver 3 which measures unknown voltage $V_s$ applied to the sensor.

The transmitter 1 has a source 11, e.g. a laser, which generates monochromatic light (constant or pulsed), a linear polarizer 12 (P1) which plane polarizes the light, and a first wave retarder 13, e.g. a quarter-wave retarder (W/4) ("W" in the text represents wavelength lambda). The polarizer 12 and retarder 13 thus function as an elliptical polarizer. The light emitted from transmitter 1 is preferably circularly polarized monochromatic light so that light incident to sensor 2 is insensitive to rotation of transmitter 1 about the optical axis with respect to the source 11.

Sensor 2 has an E-O element 21, and lower and upper electrodes 22, 23. The lower electrode 22 is connected to ground and the upper electrode 23 is connected by a wire 24 to voltage $V_s$ to be measured (e.g., a high voltage power line).

In this first embodiment, as well as all other embodiments herein, it is preferable, though not required, to encapsulate (not shown in this embodiment) electrodes 22, 23 in E-O element 21, using techniques well known in the art. Encapsulation avoids flashover and tracking problems.

The incident light, composed of x (cross) and p (parallel) components enters E-O element 21 with the x and p components having a relative phase difference of $\pi/2$ due to wave retarder 13 and emerges from sensor 2 with a relative retardation of $\pi/2 + D_s$. The relative retardation $D_s$ depends upon sensor voltage $V_s$, the E-O properties ($B_k$ or $B_p$) of element 21, dimensional characteristics $d_s$ and $L_s$, and noise including mechanical and temperature stresses which can range from a small fraction of a radian to many radians.

The light emerging from sensor 2 passes to receiver 3 where the light is incident upon compensator 31 formed by an E-O material 31a and lower and upper electrodes 31b and 31c. (These electrodes may also be encapsulated.) Electrode 31b is connected to ground, and electrode 31c is connected to a high voltage driver 37 (an op-amp) for receiving voltage $V_c$, the output of the driver 37. When compensator 31 receives $V_c$ of a proper polarity (as explained below), E-O element 31a causes a phase retardation $D_c$ to compensate for $D_s$ so as to satisfy the control equation, i.e. equation (1) above. The light, after passing through the compensator, enters a second wave retarder 32 (W/4) oriented so as to remove any wave retardation caused by the first retarder 13. If retarder 13 is omitted, retarder 32 should be omitted. Any net retardation due to the presence or absence of retarders 13, 32, can be taken into account in determining $D_n$ of the control equation.

Figure 3:
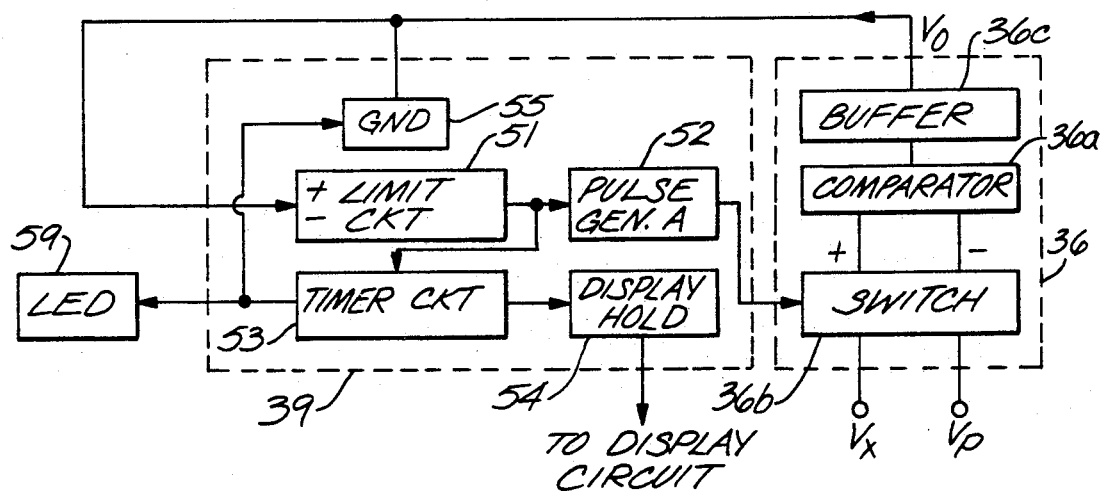
FIG. 3 is a schematic of switching, reset and comparator circuitry suitable for use with the embodiment of FIG. 1.

The light passing through retarder 32 enters a polarizing beam splitter 33 which separates the x and p components. A first detector 34a (D1) generates a voltage $V_x$ dependent on the intensity ($I_x$) of the x component, and a second detector 34b (D2) generates a voltage $V_p$ dependent upon the intensity ($I_p$) of the p component. Detectors 34a, 34b are formed by any suitable device such as a photo detector, and may include means to amplify the generated voltage. The output voltages $V_x$ and $V_p$ are proportional to $I_x$ and $I_p$, respectively, as shown below.

$$I_x = I_0 \sin^2(D_n/2) \quad (9)$$

$$I_p = I_0 \cos^2(D_n/2) \quad (10)$$

where the total or maximum intensity of the light (incident upon receiver 3) is $I_o$. The actual value of $I_o$ is not of concern, because the receiver 3 will use a relative difference between $I_x$ and $I_p$ for signal processing. That is, the voltages $V_x$ and $V_p$ are received at positive and negative inputs, respectively, of a comparator in comparator circuit 36. The output of comparator circuit 36, designated $V_0$, drives driver 37 to produce $V_c$ and thus $D_c$. Comparator circuit 36 may simply include a comparator, or can be formed by a comparator and a buffer amplifier to smooth out the comparator output. In addition, comparator circuit 36 can be formed as shown in FIG. 3, when the gain of the receiver circuitry is insufficient to produce and maintain $D_c$ in view of changes in $D_s$ due to $D_t$.

Such a circuit is only needed if the high voltage driver cannot output sufficient $V_c$, in view of its limitations and the design of compensator 31 as well as the design of sensor 2, the sources of noise to which the sensor is subject and the unknown voltage $V_s$, to create a compensator retardation $D_c$ that will fully offset the sensor retardation $D_s$. In the case of sufficient gain, the switching circuit 39 is simply omitted.

$V_0$ also drives a display circuit 38 which contains circuitry (shown in more detail in FIG. 2) to convert $V_0$ into a DC voltage properly scaled in view of the applicable relationship set forth in one of equations (4) through (7) between characteristics of sensor 2 and compensator 31.

The measuring device thus constructed works as follows:

Transmitter 1 directs monochromatic circularly polarized light through sensor 2. Sensor 2 creates a relative retardation $D_s$ of the x component with respect to the p component. Accordingly, the x and p components will be out of phase by any initial wave retardation (from wave retarder 13) plus $D_s$ after passing through sensor 2. The light reaches compensator 31, passes through second wave retarder 13 which removes any initial wave retardation, leaving only $D_s$. The x and p components are split by polarizing beam splitter 33 such that detector D1 measures intensity of the x component and outputs voltage $V_x$ and detector D2 measures intensity of the p component and outputs $V_p$. Comparator circuit 36 outputs a difference signal $V_0$ that quickly drives driver 37 to create a phase retardation $D_c$ which offsets $D_s$ by an amount which causes a net phase retardation $D_n$ such that the output of comparator circuit 36 goes to zero. In other words, this feedback loop creates a $D_c$ which satisfies the control equation. Whenever $D_{HV}$ and $D_t$ cause $D_s$ to change, the feedback loop drives comparator circuit 36 back to zero. Thus, the E-O feedback loop dynamically maintains $V_x$ equal to $V_p$ to maintain $V_0$ dynamically stable at a value having a component ($V_0$) related to $V_s$ by the control equation.

It is not necessary to match the gains of detectors D1, D2, but the signal to noise ratio is greatest when D1 gain = D2 gain, so that D1 output = D2 output ($V_x = V_p$). However, possible ways to match the gains include using an appropriate amplifier or amplifiers, or adding a bias voltage to one of the detector outputs.

As a result of this dynamic stabilization at $V_0$, the display circuit 38 shows the AC voltage component $V_0'$. For high voltage power applications, generally it is the AC voltage that is of interest. In order to determine the unknown voltage $V_s$ in AC, circuit 38 in FIG. 2 implements equation (8). The value of $V_{HV}$ in equation (8) is given by $GV_0'$ (where G is the gain of driver 37). Substitution of $GV_0'$, as obtained by a filter 47, for $V_c'$ in equation (8) will indicate the unknown voltage $V_s$.

Figure 2:
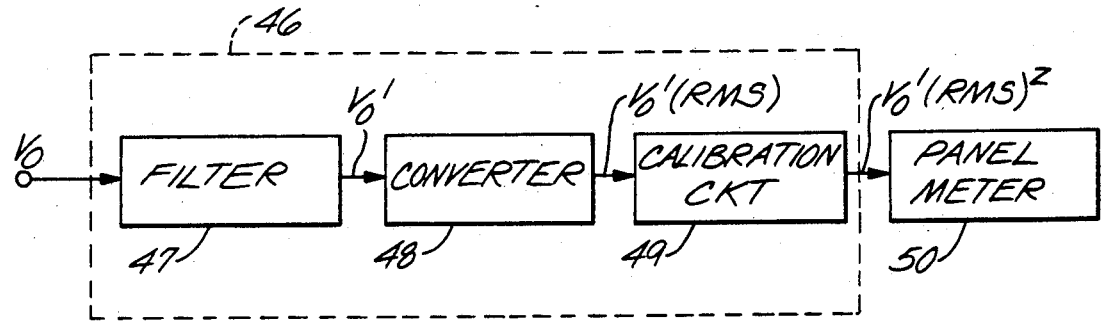
FIG. 2 is a schematic of circuitry for displaying the measurement performed by the inventive device of FIG. 1.

In the case of high voltage power lines, a common AC frequency is 60 Hz. To measure only this AC amount, a suitable display circuit 38 is shown in FIG. 2. The display circuit includes a filter, converter and calibration circuit 46, and a panel meter 50. Filter 47, such as a high pass filter, is set to receive an appropriate frequency but exclude lower frequencies. (A band pass filter will also work.) The appropriate frequency depends on the frequency of voltage $V_s$ and the proper one of equations (4) through (7) to be used to determine $V_s$. For example, for a typical high voltage line, $V_{HV}$ has a frequency of 60 Hz. The appropriate frequency would then be 60 Hz for equations (4) and (5), 30 Hz for equation (6) and 120 Hz for equation (7).

The filtered output will represent simply the AC portion $V_0'$ of $V_0$, which is then converted by a converter 48 to DC to produce $V_0'$ (RMS). This DC voltage is calibrated at calibration circuit 49 as necessary (e.g. using whichever of equations (4) through (7) is required) to produce $V_0'(RMS)^z$. For example, the calibration circuit will include a square root amplifier ($z = \frac{1}{2}$) if the sensor has an E-O element 21 of Kerr material and the receiver has an element 31a of Pockels material. After passing through the calibration circuit, a panel meter 50 or equivalent display device, which is calibrated by the constant K times gain $G^z$, displays $V_s$.

As is clear from equations (2) and (3), $D_s$ is controllable by controlling $d_s$, $L_s$ and $B_{ps}$ or $B_{ks}$. In addition, the amount of voltage $V_c$ sufficient to satisfy the control equation is controllable by setting $d_c$, $L_c$ and $B_{pc}$ or $B_{kc}$. The extent to which these design constants are controllable is determined by the birefringent properties of available materials, circuit design limitations and other practical constraints such as on the gain G of driver 37. So that $V_c$ is a reasonable amount, it is preferable to set $d_c$, $L_c$ and $B_c$ such that a maximum sensitivity (in radians/volt) is achieved. It is also preferable to keep variations in $D_s$ relatively small by obtaining a material for E-O element 21 that is relatively stress free or resistant to temperature and pressure stresses, or both. Regardless of the variations in the value of $D_s$ due to factors other than $V_s$, the compensator 31 will work because the AC part $V_0'$ of $V_0$ will mirror $V_s$. Accordingly, accuracy of measurement will be substantially temperature and pressure insensitive.

In the case where $V_c$ cannot get sufficiently large to create a compensator retardation $D_c$ capable of mirroring all changes to sensor retardation $D_s$, switching circuit 39 is employed. These limitations on $D_c$ are expressed by the following equations:

$$D_c(max) < D_t(max) + D_{HV}(max) \quad (11)$$

where $$D_c(max) = G^2 B_{kc} V_0(max)^2 L_c/d_c^2 \text{ (Kerr)} \quad (12)$$

or $$D_c(max) = G \cdot B_{pc} V_0(max) L_c/d_c \text{ (Pockels)} \quad (13)$$

When equation (11) is true, it will not be possible to satisfy the control equation for all values of $D_s$. Accordingly, it is necessary to modify the control equation by setting $D_n \pi/2 + n\pi$. The control equation (modified by dividing by two) becomes as follows:

$$D_c/2 + D_s/2 = \pi/4 + n\pi/2 \quad (14)$$

Figure 9:
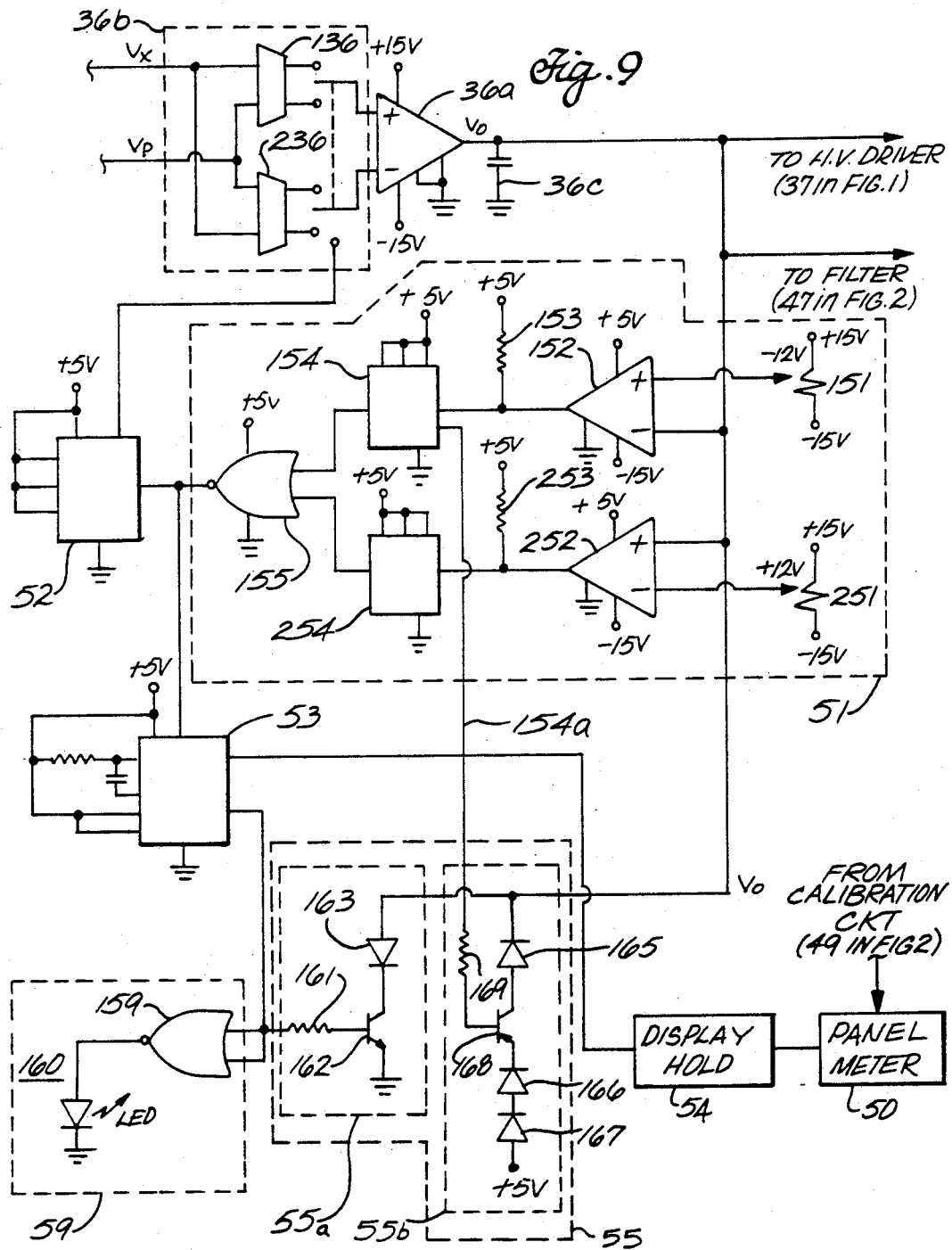
FIG. 9 is a detailed circuit diagram for the switching and reset circuit of FIG. 3.

With reference to FIGS. 9 and 11, the operation of switching circuit 39 and switch 36b will be explained. In the case where switching circuit 39 and switch 36b are not required, $n=0$ in the above equation, as $D_c$ is always sufficient to match changes in $D_s$ so that $\frac{1}{2}D_n$ remains $\pi/4$. That is, compensator 31 will always create sufficient $D_c$ to counteract changes in $D_s$ so that $V_x$ remains equal to $V_p$. Therefore, the feedback loop dynamically stabilizes at point CP1 in FIG. 11.

When equation (11) is true, there will be a time when $D_t/2$ will "pull" $D_c$ off of point CP1. This will cause $V_p$ and $V_x$ to no longer be equal. The feedback circuitry will seek the next point where $V_x = V_p$ (at CP2). However, under these circumstances the circuit can never reach point CP2 because when $V_p$ heads toward point P2 and $V_x$ heads toward point X2, the value of $V_x$ is greater than the value of $V_p$. This causes $V_x - V_p$ to change sign in turn causing $V_c$ to change sign. This creates a $D_c$ that adds to, rather than subtracts from, $D_s$.

To compensate for this sign change in $V_c$, the leads to comparator 36a are switched so that $V_x - V_p$ becomes $V_p - V_x$. This lead switching is accomplished by detecting when $V_0$ is near its positive or negative limit using a limit circuit 51, then issuing a pulse from pulse generator A 52 (e.g., a one shot monostable timer) to switch 36b so that $V_p$ goes to the positive terminal and $V_x$ goes to the negative terminal of comparator 36a (see FIGS. 3 and 9). During this switching operation, it is preferable to ground $V_0$ using a ground circuit 55 controlled by timer 53 such as a monostable timer. The exact duration of the signal from the timer 53 is not critical, but it should last at a minimum for the time it takes to perform the lead switching operation and the display output and comparator output to stabilize. This is normally on the order of microseconds. It is also preferable during the switching operation to hold panel meter 50 at its current value using display hold circuit 54. Switching circuit 39 thus keeps the display and output of comparator 36a stable during the switching operation. In other words, the switching operation is set to last sufficiently long so that $V_x$ and $V_p$ have already gone past points P2 and X2 and are moving toward point CP2 when panel meter 50 is released and $V_0$ is no longer grounded. It should be noted that the normal update time of the panel meter may be sufficiently long that a hold signal is unnecessary. When $D_t$ causes $V_0$ to reach its limit again as detected by limit circuit 51, the same switching process takes place, including switching the inputs to comparator 36a again. This process continues for as long as the operator continues measuring voltage $V_s$.

The switching operation will also automatically occur if initially $V_x - V_p$ is the wrong polarity to counteract $D_s$, as the positive or negative limit will be approached in this case too.

Any portion of $D_s$ that is not time varying can cause any number of phase changes between x and p. The actual magnitude of the total phase change is irrelevant; all that is relevant is the difference between the nearest multiple of $2\pi$ (i.e. $\pi$ in FIG. 11) and the total phase change. Therefore, $D_n/2$ need only be controlled so as to be equal to $\pi/4$ or $\pi/4$ plus any integer multiple of $\pi/2$. The only effect of phase changes is whether the multiple of $\pi/2$ is even or odd, which affects whether $V_x$ or $V_p$ is connected to the positive terminal of the comparator in the case where switching inputs is required.

If the gain of the high voltage driver is sufficient to control $D_c/2$ by an amount equal to or greater than $\pi$, then every other multiple of $n(\pi/2)$ can be skipped. In other words, the switching circuitry can control $D_n/2$ so that when the limit circuits detect that $D_c/2$ can no longer counteract $D_n/2$ to stay at point CP1, switching is controlled so that the next stable point is CP3. Accordingly, switch 36b and switching signal generator 52 are not necessary. In this case, timer 53 will be on for a sufficient time to reach the new control point CP3 and hold circuit 54 will again be on for a sufficient time to obtain a stable output on the panel meter.

Of course, depending on the gain, it is possible to skip any multiple of $\pi/4 + n(\pi/2)$. As noted previously, the value of $D_n/2$ in the control equation is not limited to $\pi/4 + n(\pi/2)$, as $V_x$ or $V_p$ could receive a bias voltage before being inputted to comparator 36a. It is also possible to move the control point to the left on the graph of FIG. 11, as in the case where $D_t$ is decreasing.

In summary, for any whole number n, when the control equation is satisfied, the outputs of the detectors D1, D2 will be equal. As noted above, although non-equal points for the outputs of the detectors can be chosen in the control equation, this requires using a biasing voltage or other means so that the detector outputs can be compared. Moreover, the x and p components have intensity curves more sensitive to changes in angle at $D_n/2 = n(\pi/2)$ than other angles, where $n=$ any whole number. For example, control retardations $D_n/2$ which are close to 0 or $\pi/2$ have small differences in intensity for relatively large changes in control angle, making it more difficult to accurately determine voltage.

FIG. 4

Figure 4:
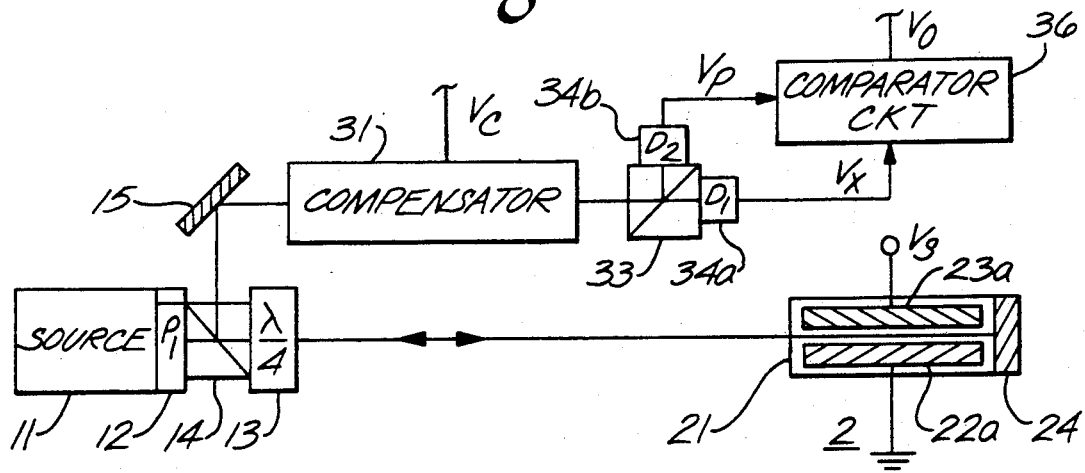
FIG. 4 is a schematic of a second embodiment of the invention in which light passes through an electro-optic element twice to double the element's effective length.

In the embodiment of FIG. 4, the effective length $L_s$ of sensor 2 is doubled by placing a mirror 24 (e.g. a corner cube reflector) at one end of E-O material 21. Sensor 2 is otherwise the same as shown in FIG. 1, except that electrodes 22a, 23a are shown encapsulated. Transmitter 1 is formed by the same elements as in FIG. 1 except that a beam splitter 14 is located between polarizer 12 and wave retarder 13. Element 14 allows light to pass toward the sensor, but reflects light returning from the sensor. The light beam passes through E-O material 21 and back through wave retarder 13 which removes the quarter wave retardation imparted on the way to sensor 2. Element 14 reflects the beam toward a mirror 15 which further reflects the beam toward compensator 31. Compensator 31 is formed the same way as in FIG. 1, and receives $V_c$ from a high voltage driver as in FIG. 1. The beam passes through the compensator to a polarizing beam splitter 33 so that detectors 34a, 34b receive the x and p components of the beam and output $V_x$ and $V_p$ to comparator circuit 36. The receiver is otherwise the same as in FIG. 1, so the remaining circuitry has been omitted for the sake of simplicity.

An advantage of this embodiment is that the effective length of E-O material 21 is doubled, increasing the overall sensitivity to voltage. Moreover, the structure of FIG. 4 eliminates the need to position the receiver circuitry on a side of the sensor opposite from that of the transmitter circuitry.

FIG. 5

Figure 5:
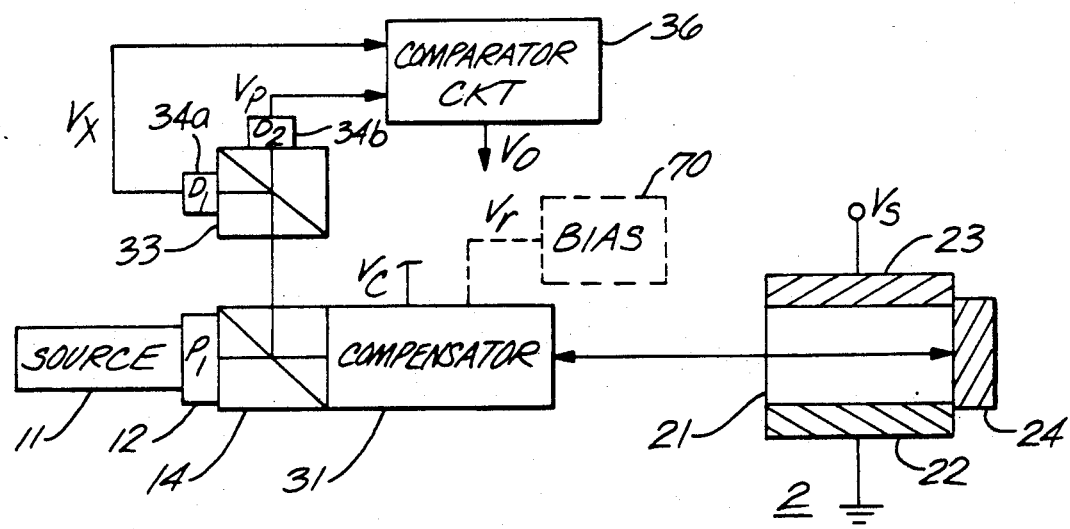
FIG. 5 is a third embodiment of the invention in which light passes through a compensator and sensor twice to double their effective lengths.

FIG. 5 shows a "double pass" arrangement in which the beam from source 11 not only passes through sensor 2 twice, but also passes through compensator 31 twice. Accordingly, the compensator will create twice the retardation as in a "single pass" arrangement such as FIGS. 1 or 4. Components in FIG. 5 that are the same as in FIG. 1 are numbered the same.

FIG. 5 differs from FIG. 1 in that a mirror 24 is placed on the far side of sensor 2 and compensator 31 is placed between source 11 and sensor 2 so that the beam passes through the compensator twice. Element 14 is disposed between compensator 31 and polarizer 12. Element 14 reflects the light beam to a polarizing beam splitter 33 after the beam returns from sensor 2 and passes through compensator 31 again. Beam splitter 33 separates the x and p components of the light beam. The x and p components are processed and ultimately voltage $V_c$ is applied to compensator 31 as in FIG. 1. However, in FIG. 5 $V_c$ need only be one half the size as in FIG. 1 due to the two passes through compensator 31 doubling its effective length $L_c$. FIG. 5 may include a "retardation" voltage $V_r$ applied to compensator 31 by a bias circuit 70. This bias or retardation voltage takes the place of a wave retarder, as its sign and magnitude are selected, based on $L_c$, $d_c$ and $B_k$ or $B_p$ of the compensator, to create a quarter wave retardation. Alternatively, FIG. 5 may include a wave retarder disposed either before or after compensator 31.

Figure 6:
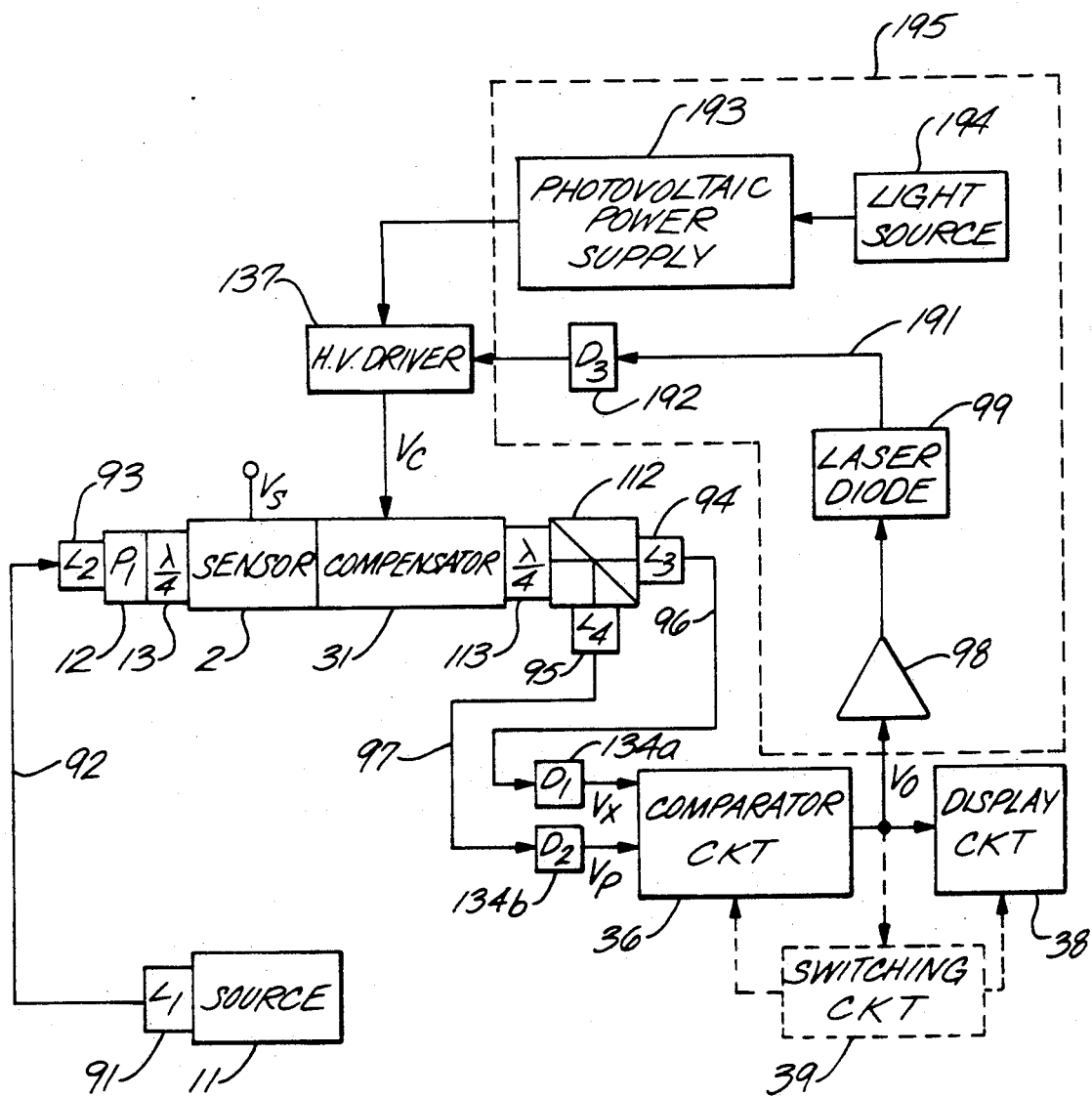
FIG. 6 is a fourth embodiment of the invention in which optical fibers transmit the light.
Figure 7:
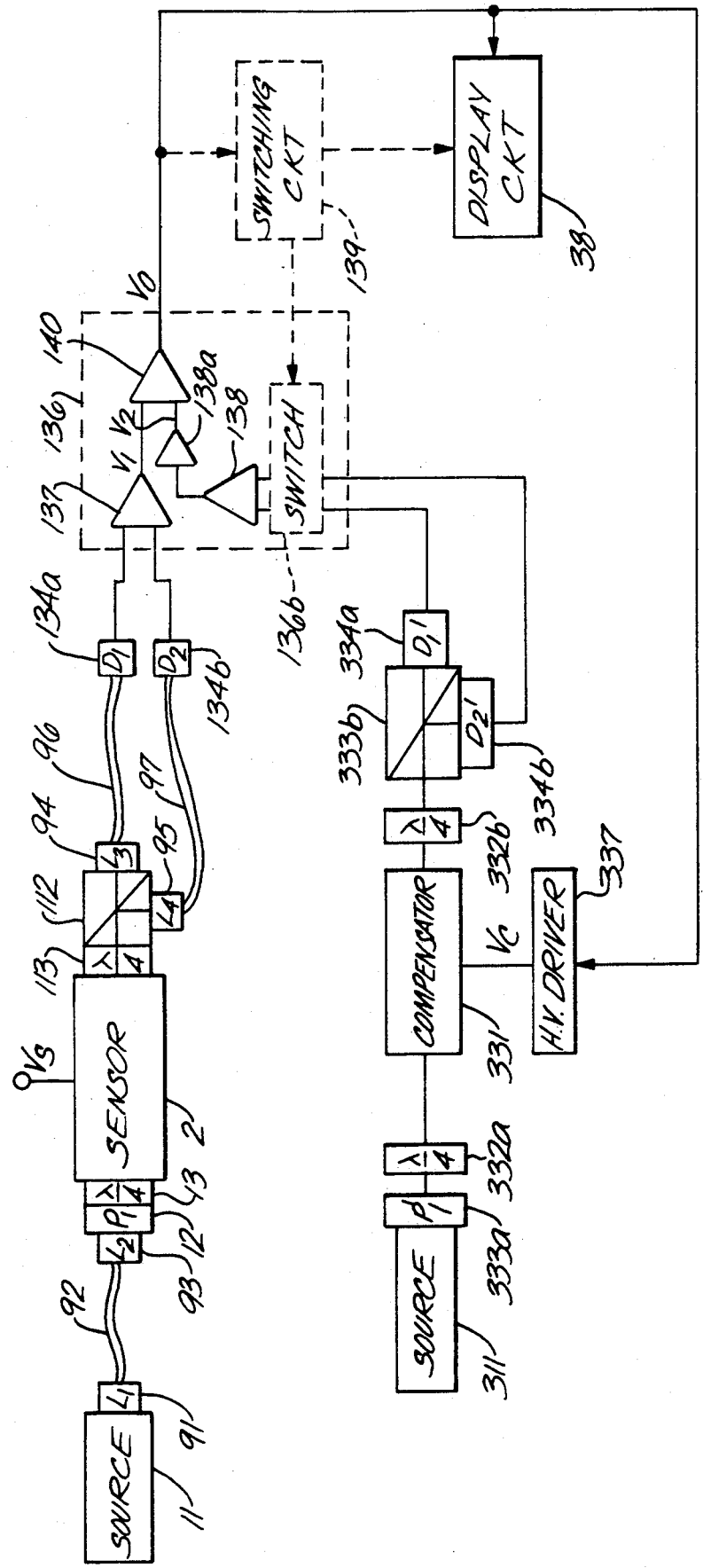
FIG. 7 is a fifth embodiment of the invention which also uses optical fibers to transmit the light.

FIGS. 6 and 7

In the embodiments of FIGS. 1, 4, and 5, the phase retardations created by the sensor and compensator are preserved, that is the light travels through phase preserving media, i.e., open air, between the sensor and compensator, and the compensator and detectors. Other phase preserving media simply could be substituted for open air, such as light pipes or polarization preserving optical fibers (with coupling lenses as necessary). The embodiments of FIGS. 6 and 7 differ from those of FIGS. 1, 4, and 5 in that nonphase preserving media, namely nonphase preserving optical fibers, are used to carry light. Replacement of the open air path with optical fibers eliminates any need to align the beam from the transmitter with the sensor and/or compensator. Such alignment where the light beam travels through air is difficult. To simplify alignment, appropriate focusing and collecting lenses may be used at the output faces of the transmitter and sensor, and at the input faces of the sensor and receiver, respectively. Optical fibers avoid alignment difficulties, but will only preserve the polarization state of the light beam if they are polarization preserving. However, polarization preserving fibers are expensive and may be impractical under certain circumstances (i.e., long distance). The arrangements of FIGS. 6 and 7 eliminate such fibers.

In FIG. 6, source 11 generates a beam just as in FIG. 1. However, first polarizer 12 and first wave retarder 13 are located proximate to sensor 2 rather than source 11. With this structure, a first optical fiber 92 carries the beam from source 11 to polarizer 12 without preserving any polarization state. Coupling lenses 91, 93 couple the source and optical fiber and the optical fiber and first polarizer 12. After the beam passes through first polarizer 12 and first wave retarder 13, the now circularly polarized beam passes through sensor 2 constructed just as in FIG. 1. Next, the beam passes through compensator 31 constructed as in FIG. 1, followed by a second wave retarder 113 and a first polarizing beam splitter 112. The resultant x and p components of the beam enter optical fibers 96, 97, via coupling lenses 94, 95, respectively. The x and p beams respectively enter first and second detectors 134a, 134b. The outputs of these detectors are compared in the comparator circuit 36 constructed as in FIG. 1. The comparator circuit 36 outputs a difference signal $V_0$.

As in the case of FIG. 1, this difference signal $V_0$ passes to display circuit 38 (and if necessary switching circuit 39), and will also be used to drive a high voltage driver 137. In FIG. 6, driver 137 is driven by sending the signal $V_o$ through amplifier 98, and using the amplified signal to trigger a laser diode 99 for converting the signal into a light beam. Optical fiber 191 carries the light beam to a photodetector (D3) 192, which triggers driver 137. In this embodiment, driver 137 may also require additional power, which may be supplied by a photovoltaic power supply 193 driven by a light source 194. It should be emphasized that elements 98, 99, 191, 192, 193, and 194, which constitute a drive signal and power transmission mechanism 195, are used in this case to avoid the necessity of transmitting electrical signals to the vicinity of sensor 2. That is, since compensator 31 is placed adjacent to sensor 2 in this embodiment, while the comparator circuitry is remote from the sensor, it is necessary to transmit a driving signal to the compensator, In FIG. 6, this is done with light (fiber 191) to avoid transmission of an electrical signal which would be subject to interference more easily. Nevertheless, if desired, the drive signal and power transmission mechanism 195 can be simply replaced with a wire extending from comparator circuit 36 to driver 137 and a local power source for the driver.

In FIG. 7, the compensator is placed remote from the sensor. The compensator cannot be placed in the path subsequent to optical fibers 96, 97, because the phase retardation is not preserved. Therefore, it is necessary to send a separate light beam through the compensator and compare the x and p components of the light beam acted on by the compensator. The result is then compared to a result of comparing the x and p components of the light beam acted on by the sensor.

In more detail, the arrangement of source 11 through detectors 134a, 134b is the same as in FIG. 6, except that compensator 31 is eliminated, so sensor 2 is sandwiched by first and second quarter wave retarders 13 and 113. After the x and p components of the light enter detectors 134a, 134b, respectively, the detectors output voltages $V_x$ and $V_p$. These voltages are compared by a first comparator 137 in comparator circuit 36. The comparator 137 outputs a first difference signal $V_1$.

Compensator 331 in this embodiment is outside th loop from source 11 to first comparator 137. A source 311 generates a beam separate from the beam generated by source 11. This separate beam is preferably circularly polarized, e.g., by using a third polarizer 333a and a third quarter wave retarder 332a, before entering compensator 331.

Compensator 331 is constructed the same as in FIG. 1. Also as in FIG. 1, compensator 331 is subjected to an electric field as a result of voltage $V_c$ from a driver 337 to create a retardation $D_c$. The beam then passes through a fourth wave retarder 332b to remove the retardation imparted at third wave retarder 332a. The remaining retardation is due solely to $D_c$. This retardation $D_c$ is sensed by passing the light to a second polarizing beam splitter 333b which transmits the x and p components to third and fourth detectors 334a, 334b, respectively. The outputs of third and fourth 334a, 334b are sent to a second comparator 138 whose output is a second difference voltage $V_2$. Voltages $V_1$ and $V_2$ are inputted to a third comparator 140, which outputs a third difference signal which corresponds to voltage $V_0$ As in FIG. 1, voltage $V_0$ drives driver 337 and display circuit 38.

In comparator circuit 136, the difference signal from second comparator 138 may need to be amplified to balance the inputs $V_1$ and $V_2$ to the third comparator 140. For this purpose, an amplifier 138a is shown following second comparator 138. Should it be necessary to switch leads, or at least to ground signal $V_o$ in the case where the gain of driver 337 is sufficient to create a $D_c/2$ of $n\pi$, switching circuit 139 and, if necessary, lead swapping switch 136b, are shown in dashed lines.

This embodiment has a drawback in that the device may have "blind spots." That is, it is possible for the sensor phase shift $D_s/2$ to go to 0 or $n\pi/2$ where the device will be insensitive (see FIG. 11). Therefore, with this embodiment, it is advisable to control the temperature of the sensor, or perhaps provide a mechanism to disable the device when $D_s$ approaches 0 or $n\pi/2$, and a mechanism to re-enable the device when $D_s$ moves away from 0 or $n\pi/2$.

FIG. 8

Figure 8:
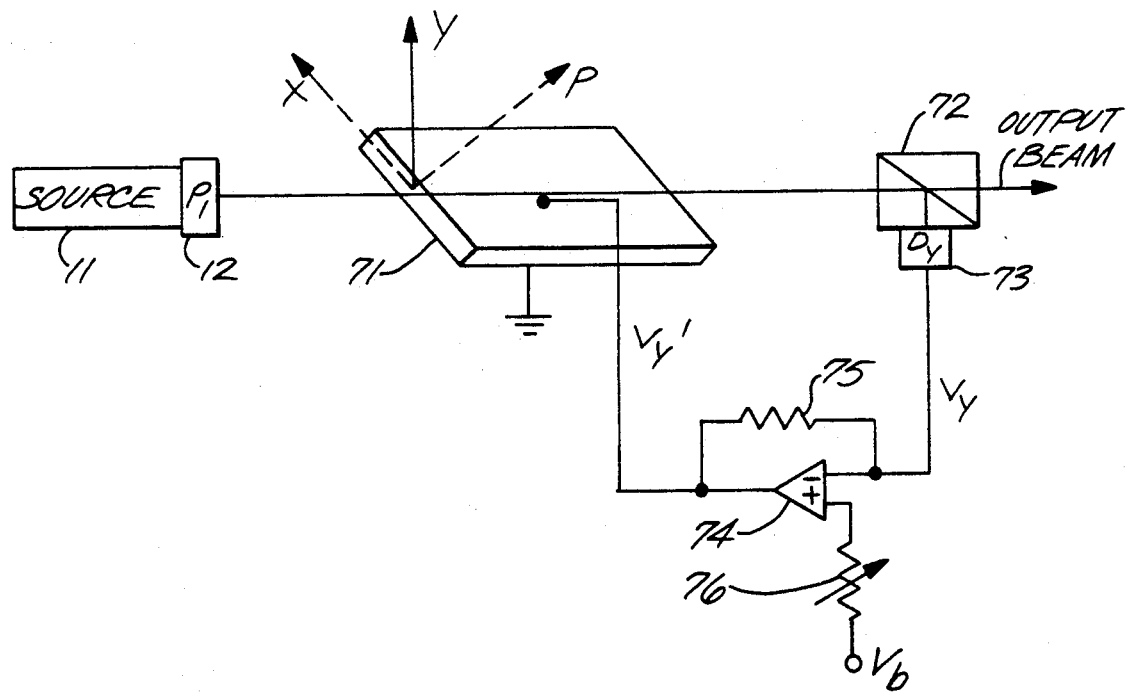
FIG. 8 is a schematic of an inventive light-intensity regulator for use with the inventive measuring device.

FIG. 8 shows a variation of transmitter for regulating the intensity of light created by source 11. An E-O material (element) 71 receives a linearly polarized light beam from an unregulated source 11 and polarizer Pl for polarizing along a Y axis. The light is incident on E-O element 71 along the Y axis and has components x and p. A beam splitter 72 splits part of the beam so that the intensity of the light emerging in plane Y from E-O element 71 is measured by a detector $D_y$ 73. The detector output a voltage $V_y$ corresponding to the intensity of the light along the Y axis. This voltage $V_y$ which will vary in response to intensity changes in the light, enters an inverting terminal of a difference amplifier 74. The positive terminal of amplifier 74 receives an adjustable biasing voltage from a source $V_b$ across a variable resistor 76. Voltage $V_b$ has an initial value which yields the desired intensity $I_y$. Amplifier 74 outputs a voltage $V'$ which is fed back across a resistor 75 to the inverting terminal. Voltage $V_y'$ drives E-O element 71 so as to keep $V_y$ constant and thus intensity of the output beam remains constant For example, when intensity $I_y$ increases, $V_y$ will increase proportionately causing $V_y'$ to increase and therefore reduce $I_y$ by the E-O effect on the y component. When intensity $I_y$ decreases, $V_y$ will decrease proportionately to produce an E-O effect to increase $I_y$ accordingly.

This intensity controller could be added to the embodiment of FIG. 5, for example, by using beam splitter 72 in place of beam splitter 14, and adding 35 elements 71 and 73–76.

FIG. 9

FIG. 9 shows a particular embodiment of the switching circuit 39 in detail for the case where the inputs to the comparator must be switched.

The limit detection circuit 51 includes:

a difference amplifier 152 whose positive terminal is connected to a source 151 of $-12V$ and whose negative terminal is connected to $V_o$, so that amp 152 outputs a positive signal when $V_o$ becomes less than $-12V$;

a difference amplifier 252 whose negative terminal is connected to a source 251 of $+12V$ and whose positive terminal is connected to $V_o$, so that amp 252 outputs a positive signal when $V_o$ increases above $+12V$;

two $+5V$ sources are connected through respective resistors 153, 253 to pull up the voltage; and two monostable timers 154, 254 so that when the output of one of comparators 152 or 252 goes high, they latch it and output a pulse through a gate 155.

The OR gate outputs a signal which activates bistable flip flop 52 and monostable timer 53. When flip flop 52 receives a signal from gate 155, the flip flop 52 issues a signal causing the leads to positive and negative inputs of comparator 36a to switch terminals on double poles 136, 236, respectively, of 25 switch 36b. The OR gate 155 also controls timer 53, which outputs a positive pulse to display hold circuit 54 and a negative pulse to LED circuit 59 and positive limit ground circuit 55a. In particular, the timer's signal goes to both inputs of a gate 159 whose output turns on LED 160. The timer's signal also passes through a resistor 161 to turn on a transistor (NPN) 162 so that $V_o$ passes through a diode 163, and through the transistor to ground. When the negative limit is exceeded, rather than operate positive limit ground circuit 55b through the timer 53, a positive output of timer 154 is sent through a resistor 169 to turn on a transistor (PNP) 168, thus adding sufficient bias via transistor 168 and diodes 165, 166, and 167 to bring $V_o$ close to ground. Other than operating ground circuit 55b in this manner, the operation of the rest of the switching circuit is the same for the positive and negative limits.

FIG. 10

Figure 10:
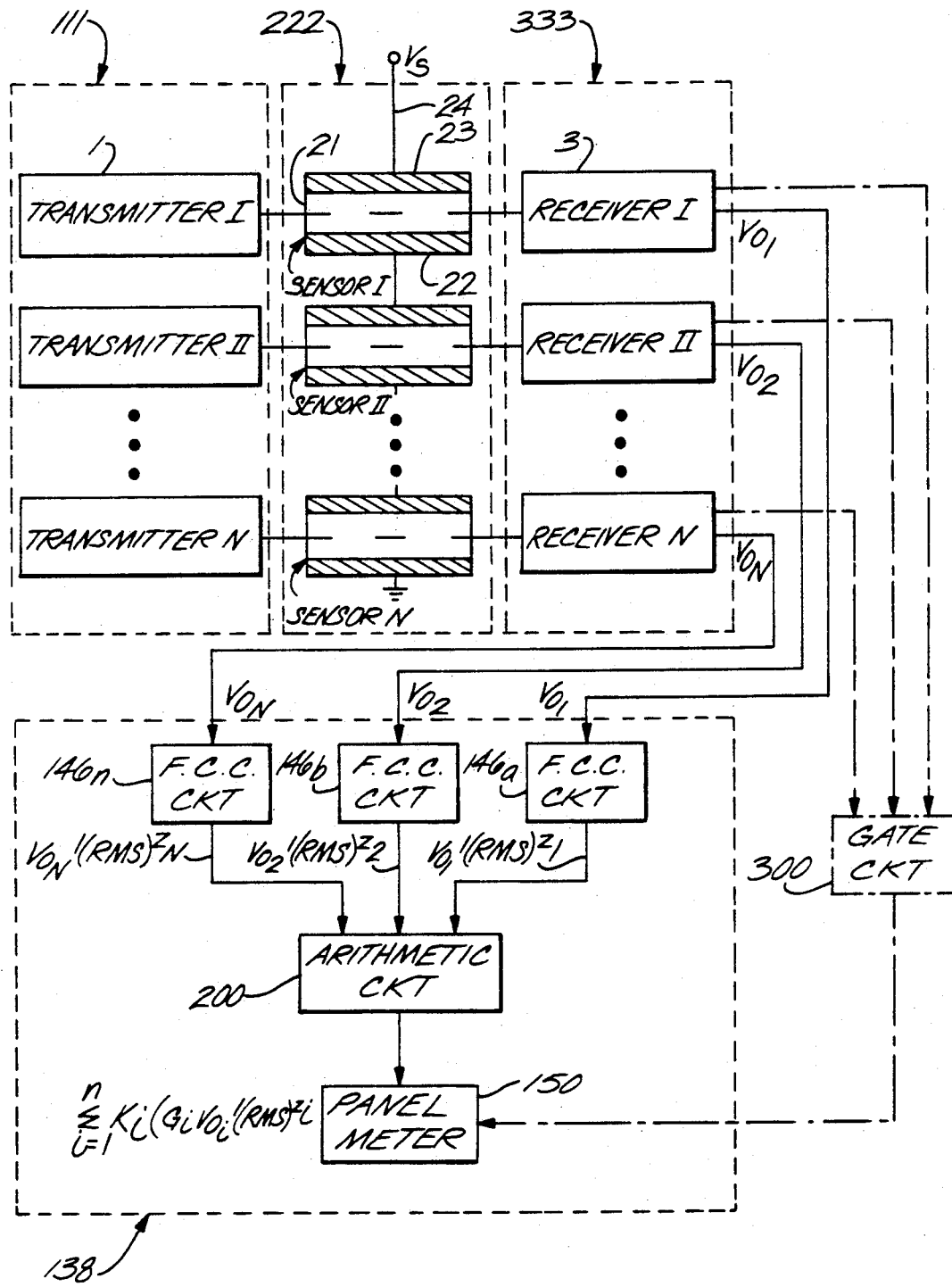
FIG. 10 is a schematic diagram of a sixth embodiment of the invention in which multiple sensor elements are used.

FIG. 10 shows a further embodiment of the invention wherein there are multiple sensing elements, stacked one on another, acting essentially as a voltage divider. However, this embodiment has the advantage that the voltage on each sensor can have substantially any relationship (linear or nonlinear) to the voltages on the other sensors, without sacrificing accuracy of measurement. In fact, accuracy may be increased, because in the case of one sensing element, the voltage will often be spread nonuniformly across the element, while in the case of multiple elements, the nonuniformity of field across each element is minimized due to the reduction in field strength across each element. Moreover, the voltages needed to drive each compensating element will be reduced as compared to the case of only one sensing element and one compensating element.

In FIG. 10, a transmitter unit 111 formed by transmitters I, II, ..., N (each constructed, e.g., as transmitter 1 in FIG. 1) directs n beams toward respective sensors I, II, ..., N in a sensing unit 222. The transmitter unit 111 could also be formed by one transmitter with means to split its beam into n beams The upper sensor I has its upper electrode 23 connected to $V_s$. Each sensor is constructed, e.g., as sensor 2 in FIG. 1, but with its lower electrode connected to a next sensor in the sensing unit, the last sensor N having its lower electrode connected to ground. The sensing unit 222 acts essentially as a voltage divider, so that the voltage across each sensor is much smaller than $V_s$. Each beam emitted from each sensor reaches a respective one of receivers I, II, ..., N in a receiver unit 333. Each receiver is constructed, e.g., as receiver 3 in FIG. 1, but with display circuit 38 removed and the output $V_o$ of each receiver linked with one display circuit 138 determining a total voltage which drives panel meter 150.

More particularly, each associated transmitter, sensor, and receiver i (where i=I, N), is constructed as in and operates as in FIG. 1 or any other embodiment. However, instead of (or in addition too) a display circuit in each receiver i, there is one display circuit 138. Each $Vo_i$ is inputted to a respective filter, converter and calibration circuit (F.C.C. ckt) 146a, 146b, ..., 146n. Each F.C.C. ckt is constructed with the same elements as is circuit 46 in FIG. 2, but each associated transmitter, sensor and receiver i dictates the design constraints. Arithmetic circuit 200 scales each $Vo_i$(RMS) by multiplying each $Vo_i$(RMS) by constant $K_i$ times gain $G^Z i$, where i=1,2, ..., n, and then sums all of the results. Panel meter 150 displays the result.

Should lead switching be necessary in any of the receivers I, II, ..., N, display hold signals (shown by dot-dash lines) may be sent through a gate circuit 300, such as an OR gate, to hold panel meter 150 during any switching. If the hold signals generated in each receiver are so numerous and asynchronous that it is substantially impossible to obtain a stable reading on meter 150, one could use appropriate buffers for the $Vo_i$ receiver outputs or some other means to synchronize the $V_o$ outputs to obtain a stable readout.

The invention is quite useful for measuring voltage of a high voltage power line. In such a case, it is simplest to support sensor 2 on a pole or the like proximate the power line, and direct light from transmitter 1 on the ground into the sensor. In the embodiments where the sensor is formed with a mirror, the light from the transmitter is reflected back down to the transmitter which can also include receiver circuitry, e.g. as in FIGS. 4 and 5. Alternatively, the arrangements of FIGS. 6 and 7 could be used. Advantages of all of the embodiments of the invention are accurate, reliable, inexpensive and practical electro-optic measurement devices. Measuring is performed without using a computer and without measuring physical and thermal stresses or other noise influencing the birefringent effect on the E-O element.

The devices shown above are adaptable to measure the slow moving components of the retardation $D_s$ caused by physical or thermal stresses on the sensor. By filtering out all time varying components, DC voltage can be measured. If switching must occur, some means to count the number of switches could be used). However, it may be difficult to filter out sufficient noise where the sensor is subject to thermal and mechanical stresses. Therefore it is preferable that the sensor be temperature insensitive and stress free. Combinations of these measurements can also readily be made.

The above embodiments of the invention are illustrative, as numerous equivalent variations will be evident to those of ordinary skill in the art. For example, instead of using polarizers for the laser light beam, a polarized laser source may be used. Moreover, the wave retarders can be omitted, as they are only used to enhance the E-O effect by creating circularly polarized light. All that is necessary is that the light from the transmitter be incident on the sensor such that there are x and p components.

It is preferred to provide insulation around wire 24. Suitable insulating materials for high voltage from a power line are a quartz-filled epoxy, or porcelain, as well as other materials well known in the art. The effective length $L_s$ of the electric field and the effective distance $d_s$ between the electrodes are design parameters. An example of a suitable $d_s$ is 3 mm, and $L_s$ can also be on the order of mm or cm.

As noted previously, if the gains of the detectors D1 and D2 are not matched, a bias voltage of the like may be necessary to balance the gains. The effect of non-matching gains is that the $V_x$ and $V_p$ curves of FIG. 11 will have different amplitudes.

It is also possible to measure the birefringent effect using planes other than x and p. For example, planes at 10° to p and 80° to p could be used, by modifying the beam splitter proximate the detectors to split along the 10° and 80° planes. In such a case, the curves for voltages V10 and V80 emanating from the detectors will be proportional to the intensities of the light in the 10° and 80° planes.

As noted previously, the beam from source 11 is not limited to monochromatic light. The beam can be white light or any multichromatic light. The beam may also be any electromagnetic radiation where a suitable E-O material exists that will exhibit a birefringent effect for the type of electromagnetic radiation used.

In the case where multichromatic or white light is used, the retardation angles for the different wave lengths will vary, nevertheless only one voltage $V_c$ will be needed to mirror $V_s$ Accordingly, $V_o$ will have a time varying component which is at the frequency of $V_s$ that is measurable in the same way as when monochromatic light is used.

Moreover, the phase shift $D_c$ could actually add to $D_s$, and $V_p$ at a control point.

The disclosed embodiments are illustrative of the invention, and are not intended to limit the scope of the appended claims, as numerous variations of the disclosed embodiments will be evident to those of ordinary skill in the art, and will fall within the scope of the claims. ordinary skill in the art, and will fall within the scope of the claims.

What is claimed is:

1. A device for measuring voltage, comprising:
   transmitter means for providing an electromagnetic beam having a first beam component in one plane, and a second beam component in another plane transverse to the one plane;
   sensor means, including an electro-optic material subjected to an electric field having an unknown voltage, for receiving the beam, and for creating a first relative phase difference between the first and second beam components; and receiver means for receiving the beam emitted from the sensor and determining the unknown voltage, the receiver means comprising compensator means, including an electro-optic material receiving the beam from the sensor means, for causing by means of an electro-optic response a second relative phase difference in the first and second beam components which when combined with the first relative phase difference caused by the sensor means achieves a third relative phase difference; and driving means receiving the first and second beam components for generating a difference signal indicative of the third relative phase difference and for driving the electro-optic material in the compensator means on the basis of the difference signal.

2. A device according to claim 1, wherein the driving means comprises means for generating a driving voltage on the basis of the difference signal, and for applying the driving voltage across the electro-optic material in the compensator means such that the third relative phase difference corresponds to a predetermined amount.

3. A device according to claim 2, wherein the receiver means further comprises means receiving the difference signal for indicating an amount of the unknown voltage on the basis of the difference signal and a predetermined relationship between physical properties of the electro-optic material in the sensor means and the electro-optic material in the compensator means.

4. A device according to claim 3, wherein the predetermined relationship is one of the following:

$$V_c = [(d_c/d_s)(B_{ks}L_s/B_{kc}L_c)^{\frac{1}{2}}] \cdot V_s$$

$$V_c = [(d_c B_p s L_{ps}/(d_s B_{pc} L_c)] \cdot V_s$$

$$V_c = d_c[(1/d_s)(B_{ps}L_s)/(B_{kc}L_c)]^{\frac{1}{2}} \cdot V_s^{\frac{1}{2}}$$

$$V_c = [(d_c B_{ks} L_s/d_s B_{pc} L_c)] \cdot V_s^2$$

where
$V_c$ = voltage across the electro-optic material in the compensator means;
$V_s$ = voltage across the electro-optic material in the sensor means;
$d_c$, $d_s$ = distance across the electro-optic materials in the compensator means and sensor means, respectively;
$L_c$, $L_s$ = effective length of the electric field applied to the electro-optic material in the compensator means and sensor means, respectively;
$B_{kc}$, $B_{pc}$ are Kerr and Pockels coefficients, respectively, for the electro-optic material in the compensator means; and
$B_{ks}$, $B_{ps}$ are Kerr and Pockels coefficients, respectively, for the electro-optic material in the compensator means.

5. A device according to claim 3, wherein the means for indicating comprises means for filtering out of the difference signal a component having a frequency range determined on the basis of the frequency of the unknown voltage and the predetermined relationship.

6. A device according to claim 2, wherein the predetermined amount equals one half or $\pi$, or one half or $\pi$ plus any integer multiple of $\pi$.

7. A device according to claim 2, wherein the means for generating a driving voltage comprises means for amplifying the difference signal and applying the amplified signal to the electro-optic material in the compensator means.

8. A device according to claim 1, wherein the electromagnetic beam is a light beam.

9. A device according to claim 8, wherein the transmitter means further comprises a light source for generating light, means for elliptically polarizing the generated light, and a first optical fiber for carrying the generated light from the source to the means for elliptically polarizing to provide the light beam.

10. A device according to claim 9, wherein the electro-optic material in the sensor is disposed proximate the electro-optic material in the compensator.

11. A device according to claim 10, wherein the driving means comprises means for splitting the light beam into the first and second beam components after the light beam passes through the electro-optic material in the compensator, detector means remote from the compensator for converting intensity of the first and second beam components into first and second electrical signals, respectively, second and third optical fibers for carrying the first and second beam components, respectively, from the means for splitting to the detector means, comparison means receiving the first and second electrical signals for generating the difference signal by determining the difference between the first and second electrical signals, and means for amplifying the difference signal and applying the amplified difference signal across the electro-optic material in the compensator means.

12. A device according to claim 11, wherein the receiver means further comprises means receiving the difference signal for indicating an amount of the unknown voltage on the basis of the difference signal and a predetermined relationship between physical properties of the electro-optic material in the sensor means and the electro-optic material in the compensator means.

13. A device according to claim 12, wherein the means for indicating comprises means for filtering out of the difference signal a component having a frequency range determined on the basis of the frequency of the unknown voltage and the predetermined relationship.

14. A device according to claim 21, wherein the comparison means comprises a comparator for generating the difference signal, and the receiver means further comprises polarity corrector means for receiving the difference signal, for detecting when the difference signal reaches a predetermined limit, and for inverting the difference signal when the limit is detected.

15. A device according to claim 10, wherein the predetermined amount equals one half or $\pi$, or one half of $\pi$ plug any integer multiple of $\pi$.

16. A device according to claim 1, wherein the transmitter means comprises a monochromatic light source, and means for plane polarizing a light beam emitted by the light source.

17. A device according to claim 16, wherein the transmitter further comprises means for circularly polarizing the plane polarized light beam.

18. A device according to claim 1, wherein the driving means further comprises means for converting intensity of the first and second beam components into first and second electrical signals, respectively, and comparison means receiving the first and second electrical signals for generating the difference signal.

19. A device according to claim 18, wherein the comparison means comprises a comparator for generating the difference signal, and the receiver means further comprises polarity corrector means for receiving the difference signal, for detecting when the difference signal reaches a predetermined limit, and for inverting the difference signal when the limit is detected.

20. A device according to claim 19, wherein the polarity corrector means comprises mans connected to positive and negative inputs to the comparator for reversing the inputs to invert the difference signal.

21. A device according to claim 1, further comprises means disposed in a path of the electromagnetic beam following the electro-optic material in the sensor means for reflecting the beam so that it returns through the electro-optic material in the sensor means so as to double the effective length thereof.

22. A device according to claim 21, further comprising means disposed between the transmitter and sensor means for allowing the beam to pass therethrough to the sensor, but for reflecting the beam to the receiver means after it returns through the electro-optic material in the sensor means.

23. A device according to claim 21, wherein the driving means comprises means for generating a driving voltage on the basis of the difference signal, and for applying the driving voltage across the electro-optic material in the compensator means such that the third relative phase difference corresponds to a predetermined amount.

24. A device according to claim 23, wherein the receiver means further comprises means receiving the difference signal for indicating an amount of the unknown voltage on the basis of the difference signal and a predetermined relationship between physical properties of the electro-optic material in the sensor means and the electro-optic material in the compensator means.

25. A device according to claim 21, wherein the means for indicating comprises means for filtering out of the difference signal a component having a frequency range determined on the basis of the frequency of the unknown voltage and the predetermined relationship.

26. A device according to claim 23, wherein the driving means comprises means for converting intensity of the first and second beam components into first and second electrical signals, respectively, and comparison means receiving the first and second electrical signals for generating the difference signal.

27. A device according to claim 26, wherein the comparison means comprises a comparator for generating the difference signal, and the receiver means further comprises polarity corrector means for receiving the difference signal, for detecting when the difference signal reaches a predetermined limit, and for inverting the difference signal when the limit is detected.

28. A device according to claim 21, wherein the electromagnetic beam is a light beam.

29. A device according to claim 21, wherein the electro-optic material in the compensator means is disposed in the path of the electromagnetic beam between the transmitter means and the sensor means, so that the beam passes through the electro-optic material in the compensator means twice, and the device further comprises means disposed in the path between the transmitter means and the electro-optic material in the compensator means for allowing the beam to pass therethrough to the electro-optic material in the compensator means, but for reflecting the beam to the driving means after the beam returns through the electro-optic material in the compensator means.

30. A device according to claim 21, wherein the predetermined about equals one half of $\pi$, or one half or $\pi$ plus any integer multiple of $\pi$.

31. A device for measuring voltage, comprising:
transmitter means for producing multiple electromagnetic beams each having a first beam component in one plane, and a second beam component in another plane transverse to the one plane;
sensor means, including multiple electro-optic elements each comprising an electro-optic material receiving a respective one of the multiple beams, for creating a first relative phase difference between the first and second beam components in each of the beams, the sensor means including means for dividing an unknown voltage across the electro-optic elements; and
receiver means for receiving the beams emitted by the electro-optic elements and determining the unknown voltage.

32. A device according to claim 31, wherein the receiver means comprises compensator means, including multiple electro-optic elements each comprising an electro-optic material receiving a respective one of the beams, for causing, by means of electro-optic response, a second relative phase difference in each of the first and second beam components, which, when combined with a respective one of the first relative phase differences caused by the electro-optic elements in the sensor means, achieves a third relative phase difference; and driving means receiving each respective first and second beam components for generating a difference signal indicative of the third relative phase difference and for driving each respective electro-optic element in the compensator means on the basis of each difference signal.

33. A device according to claim 32, wherein each driving means comprises means for generating a driving voltage on the basis of the difference signal, and for applying the driving voltage across the electro-optic material in the compensator means such that the third relative phase difference corresponds to a predetermined amount.

34. A device according to claim 33, wherein the driving means further comprises means for converting intensity of the first and second beam components into first and second electrical signals, respectively, and comparison means receiving the first and second electrical signals for generating the difference signal.

35. A device according to claim 34, wherein the comparison means comprises a comparator for generating the difference signal, and the receiver means further comprises polarity corrector means for receiving the difference signal, for detecting when the difference signal reaches a predetermined limit, and for inverting the difference signal when the limit is detected.

36. A device according to claim 31, further comprising means receiving each difference signal for indicating an amount of the unknown voltage on the basis of each difference signal and respective predetermined relationships between physical properties of each electro-optic material in the sensor means and physical properties of each electro-optic material in the receiver means.

37. A device for measuring voltage, comprising:
sensor means, including an electro-optic material having an electric field of an unknown voltage applied thereacross and receiving a first electromagnetic beam having a first beam component in one plane and a second beam component in another plane transverse to the one plane, for causing a first relative phase difference between the first and second beam components of the first electromagnetic beam by means of electro-optic response, compensator means having an electro-optic material and receiving a second electromagnetic beam having a first beam component in one plane and a second beam component in another plane transverse to the one plane, for causing a second relative phase difference between the first and second beam components of the second electromagnetic beam, receiver means for determining the unknown voltage, comprising first means for receiving the beam emmited from the sensor means, and for converting the first and second beam components into first and second electrical signals and comparison means receiving the first and second electrical signals for outputting a first difference signal indicative of a first relative phase difference therebetween.

second means for receiving the second electromagnetic beam from the compensator means and for converting the first and second beam components into third and fourth electrical signals, and comparison means for outputting a second difference signal indicative of a second relative phase difference therebetween, and means for comparing the first difference signal to the second difference signal and generating a further difference signal, means for applying a function of the further difference signal across the electro-optic material in the compensator means, and means receiving the further difference signal for indicating an amount of the unknown voltage based on the further difference signal and a predetermined relationship between the physical characteristics of the electro-optic material in the sensor means and the electro-optic material in the compensator means.

38. A device according to claim 37, wherein the first electromagnetic beam comprises a light beam, and the means for converting in the first means of the receiver means comprises means following the sensor for splitting the first beam into the first and second beam components, first and second detectors for creating the first and second electrical signals on the basis of the intensities of the first and second beam components, respectively, and first and second optical fibers for carrying the first and second beam components from the means for splitting to the first and second detectors, respectively.

39. A device according to claim 38, wherein the means for indicating comprises means for filtering out of the further difference signal a component having a frequency range determined on the basis of the frequency of the unknown voltage and the predetermined relationship.

40. A device according to claim 37, wherein the receiving means further comprises means receiving the further difference signal for indicating an amount of the unknown voltage on the basis of the further difference signal and a predetermined relationship between physical properties of the electro-optic material in the sensor means and the elector-optic material in the compensator means.

41. A device according to claim 37, wherein the comparison means in the second means in the receiver means comprises a comparator for generating the second difference signal, and the second means further comprises polarity corrector means for receiving the further difference signal, for detecting when the further difference signal reaches a predetermined limit, and for inverting the second difference signal when the limit is detected.

42. A device for measuring an electrical signal comprising:

a transmitter for providing an electromagnetic beam having a first beam component in one plane, and a second beam component in another plane transverse to the one plane;

a sensor comprising a first electro-optic material subjected to an electric field having the signal to measured and receiving the beam for emitting a beam having relative phase difference between the first and second beam components;

a compensator comprising a second electro-optic material responsive to the first and second beam components for causing the compensator to generate a further signal representative of the relative phase difference, the second electro-optic material receiving a signal representative of the further signal for combining with the phase difference represented in the further signal to achieve a predetermined amount, and an indicator responsive to the further signal for indicating an amount of the signal to be measured.

43. A device for measuring voltage, comprising:

a sensor comprising a first electro-optic material subjected to an electric field having an unknown voltage and having incident thereto an electromagnetic beam comprising a first beam component in one plane and a second beam component in another plane transverse to the one plane, for causing a first relative phase difference between the first and second beam components; and a receiver comprising a second electro-optic material, subjected to a further electric field and receiving the electromagnetic beam from the sensor, for causing a second relative phase difference between the first and second beam components which, when combined with the first relative phase difference caused by the sensor means, achieves a third relative phase difference, the receiver further comprising means for receiving the first and second beam components for generating a signal indicative of the third relative phase difference and for modulating the further electric field on the basis of the signal so as to cause the third relative phase difference to reach a predetermined amount, and means for receiving the signal for determining the unknown voltage on the basis of the signal and a relationship between physical properties of the first and second electro-optic materials.

44. A device according to claim 43, wherein the unknown voltage is a high voltage of at leas 12 kv.

45. A method for measuring an unknown voltage comprising the steps of:

directing an electromagnetic beam, having a first beam component in one plane and a second beam component in another plane transverse to the one plane, through a first electro-optic material;

subjecting the first electro-optic material to an electric field having an unknown voltage to cause a first relative phase difference between the first and second beam components by means of electro-optic response of the first electro-optic material;

directing the electromagnetic beam after it passes through the first electro-optic material through a second electro-optic material;

subjecting the second electro-optic material to a further electric field to cause a second relative phase difference between the first and second beam components due to electro-optic response of the second electro-optic material;

obtaining a signal on the basis of a third relative phase difference representing a combination of the first and second relative phase differences;

modulating the further electric field on the basis of the signal;

so as to cause the third relative phase difference to reach a predetermined amount; and determining the unknown voltage on the basis of the signal and a relationship between physical properties of the first and second electro-optic materials.

46. A method according to claim 45, wherein the step of obtaining the signal comprises the steps of splitting the electromagnetic beam into the first and second beam components, converting intensity of the first and second beam components into first and second electrical signals, respectively, and comparing the first and second electrical signals to achieve an electrical difference signal corresponding to the signal.

47. A method according to claim 46, wherein the step of determining the unknown voltage comprises filtering out of the electrical difference signal a component having a frequency range determined on the basis of the frequency of the unknown voltage and the predetermined relationship.

48. A method according to claim 45, wherein the predetermined amount equals one-half of $\pi$, or one-half of $\pi$ plug any integer multiple of $\pi$.

49. A method according to claim 45, further comprising a step of reflecting the electromagnetic beam after it passes through the first electro-optic material so that is returns through the first electro-optic material and then to the second electro-optic material.

50. A method according to claim 45, further comprising the steps of placing the second electro-optic material in a path of the electromagnetic beam to the first electro-optic material, reflecting the electromagnetic beam after it passes through the first electro-optic material so that it returns through both the first and second electro-optic materials.

51. A device for measuring an electrical signal, comprising:

a sensor means comprising a first electro-optic material subjected to an electric field having an unknown voltage and having incident thereto a first electromagnetic beam comprising a first beam component in one plane and a second beam component in another plane transverse to the one plane, for causing a first relative phase difference between the first and second beam components; and a receiver comprising a second electro-optic material, subjected to a further electric field and receiving a second electromagnetic beam having a first beam component in one plane and a second beam component in another plane transverse to the one plane, for causing a second relative phase difference between the first and second beam components of the second beam, which, when combined with the first relative phase difference caused by the sensor means, achieves a third relative phase difference, the receiver further comprising means receiving the first and second beam components of the combined phase difference for generating a signal indicative of the third relative phase difference and for modulating the further electric field based on the signal so as to cause the third relative phase difference to reach a predetermined amount, and means receiving the signal for determining the unknown voltage on the basis of the signal and a relationship between physical properties of the first and second electro-optic material.

52. A device according to claim 51, wherein the second electromagnetic beam is the first electromagnetic beam after the first electromagnetic beam has passed through the sensor means.

53. A device according to claim 51, further comprising means disposed in a path of the electromagnetic beam following the electro-optic material in the sensor means for reflecting the beam so that it returns through the electro-optic material in the sensor means so as to double an effective length thereof.

54. A device according to claim 51, further comprising transmitter means for producing a plurality of first electromagnetic beams, wherein the first electro-optic material comprises a plurality of first electro-optic elements, the plurality of first beams being incident to the plurality of first elements, respectively, and the second electro-optic material comprises a plurality of second electro-optic elements each receiving a respective one of the first beam after passing through the first electro-optic element.

55. A device according to claim 51, wherein the means receiving the first and second beam components of the combined phase differences comprises a first pair of detectors for converting the first and second beam components of the first beam into a first pair of electrical signals and a first comparator for outputting a difference of the first pair of electrical signals, a second pair of detectors for converting the first and second beam components of the second beam into a second pair of electrical signals and a second comparator for outputting a difference of the second pair of electrical signals, and a third comparator receiving the difference of the first pair of electrical signals and the difference of the second pair of electrical signals and outputting a difference thereof.

56. A method of measuring an electrical signal, comprising the steps of:

directing a first electromagnetic beam, having a first beam component in one plane and a second beam component in another plane transverse to the one plane, through a first electro-optic material;

subjecting the first electro-optic material to an electric field to cause a first relative phase difference between the first and second beam components by means of electro-optic response of the first electro-optic material;

directing a second electromagnetic beam, having a first beam component in one plane and a second beam component in another plane transverse to the one plane, through a second electro-optic material;

subjecting the second electro-optic material to a further electric field to cause a second relative phase difference between the first and second beam components due to electro-optic response of the second electro-optic material;

obtaining a resultant signal on the basis of a third relative phase difference representing a combination of the first and second relative phase differences;

modulating the further electric field on the basis of the resultant signal so as to cause the third relative phase difference to reach a predetermined amount; and determining the electrical signal on the basis of the resultant signal and a relationship between physical properties of the first and second electro-optic materials.

57. A method according to claim 56, wherein the step of directing the second electromagnetic beam comprises applying the first electromagnetic beam, after it has passed through the first electro-optic material, to the second electro-optic material.

* * * * *

UNITED STATES PATENT AND TRADEMARK OFFICE
CERTIFICATE OF CORRECTION

PATENT NO. : 5,113,131
DATED : May 12, 1992
INVENTOR(S) : David E. Cooper; Thomas J. Houy It is certified that error appears in the above-identified patent and that said Letters Patent is hereby corrected as shown below:

On the title page:

[56] References Cited, OTHER PUBLICATIONS, change "Institue" to -- Institute --; and change "Hebner, Jr.; et al.," to -- Hebner, Jr., et al. --.

Column 1, lines 23,24, change "electrooptic" to -- electro-optic --.

Column 2, line 18, change "electrooptic" to -- electro-optic --.

Column 6, line 25, change "$V_s$applied" to -- $V_s$ applied --.

Column 7, line 16, change "photo detector" to -- photodetector --.

Column 9, line 22, change "$D_n \pi/2+n\pi$" to -- $D_n = \pi/2+n\pi$ --.

Column 12, line 47, after "compensator" change the comma to a period.

Column 13, lines 2,3, between "The" and "comparator" delete the spaces except for one space.
Column 13, line 14, insert a period after "$D_c$".
Column 13, line 21, after "fourth" insert -- detectors --.
Column 13, line 25, after "$V_o$" insert a period.

UNITED STATES PATENT AND TRADEMARK OFFICE
CERTIFICATE OF CORRECTION

PATENT NO. : 5,113,131

DATED : May 12, 1992

INVENTOR(S) : David E. Cooper; Thomas J. Houy

It is certified that error appears in the above-identified patent and that said Letters Patent is hereby corrected as shown below:

Column 13, line 33, before "to" delete "25".
Column 13, line 47, after "transmitter" insert -- 1 --.
Column 13, line 56, change "output" to -- outputs --.
Column 13, line 57, change "$V_y$which" to -- $V_y$ which --.
Column 13, line 63, change "V'" to -- $V_y'$ --.
Column 13, line 67, after "constant" insert a period.
Column 13, line 68, delete the space on line 68 by inserting text from Column 14, line 1 to fill it.

Column 14, line 8, before "elements" delete "35".
Column 14, lines 31,32, change "flip flop" to -- flip-flop -- (all occurrences).
Column 14, line 35, before "switch" delete "25".

Column 15, line 8, after "beams" insert a period.
Column 15, line 25, after "addition" change "too" to -- to --.
Column 15, line 66, after "used" delete the closing parentheses.

Column 16, line 24, after "voltage" change "of" to -- or --.
Column 16, lines 24,25, after "like" and before "may" delete the spaces except for one space.
Column 16, lines 33,34, between "the" and "detectors" delete the spaces except for one space.
Column 16, line 45, after "$V_s$" insert a period.
Column 16, line 50, after "$D_s$," insert -- as long as the comparator is acting to maintain $V_x$ --.
Column 16, lines 56,57, delete the phrase "ordinary skill in the art, and will fall within the scope of the claims." (second occurrence).

UNITED STATES PATENT AND TRADEMARK OFFICE
CERTIFICATE OF CORRECTION

PATENT NO. : 5,113,131

DATED : May 12, 1992

INVENTOR(S) : David E. Cooper; Thomas J. Houy

It is certified that error appears in the above-identified patent and that said Letters Patent is hereby corrected as shown below:

Column 17, line 39, In the equation, change
"$V_c=[(d_c B_{ks} L_s / d_s B_{pc} L_c] \cdot V_s^2$"
to
-- $V_c=[d_c B_{ks} L_s / d_s^2 B_{pc} L_c] \cdot V_s^2$ --.

Column 17, line 46, before ", $d_s$" change "dc" to -- $d_c$ --.

Column 18, line 43, change "claim 21" to -- claim 11 --.
Column 18, line 51, after "half" change "or" to -- of --.
Column 18, line 52, before "any integer" change "plug" to -- plus --.

Column 19, line 6, after "comprises" change "mans" to -- means --.
Column 19, line 36, change "claim 21" to -- claim 24 --.

Column 20, line 2, after "determined" change "about" to -- amount --.
Column 20, line 2, after "one half" change "or" to -- of --.

Column 21, lines 57, 58, before "means" change "receiving" to -- receiver --.
Column 21, line 63, change "elector-optic" to -- electro-optic --.

Column 22, line 13, after "signal to" insert -- be --.
Column 22, line 57, before "12 kv" change "leas" to -- least --.

UNITED STATES PATENT AND TRADEMARK OFFICE
CERTIFICATE OF CORRECTION

PATENT NO. : 5,113,131

DATED : May 12, 1992

INVENTOR(S) : David E. Cooper; Thomas J. Houy

It is certified that error appears in the above-identified patent and that said Letters Patent is hereby corrected as shown below:

Column 23, line 35, before "any integer" change "plug" to
-- plus --.
Column 23, line 38, after "so that" change "is" to
-- it --.

Column 24, line 2, after "phase" change "difference" to
-- differences --.

Signed and Sealed this

Twenty-third Day of November, 1993

Attest:

BRUCE LEHMAN

Attesting Officer    Commissioner of Patents and Trademarks